US009446679B2

(12) United States Patent
Kataoka et al.

(10) Patent No.: US 9,446,679 B2
(45) Date of Patent: Sep. 20, 2016

(54) BATTERY SYSTEM, ELECTRIC VEHICLE, MOBILE UNIT, ELECTRIC POWER STORAGE DEVICE AND POWER SUPPLY DEVICE

(75) Inventors: Shinya Kataoka, Hyogo (JP); Osamu Nakano, Osaka (JP); Tsuyoshi Watanabe, Gifu (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 373 days.

(21) Appl. No.: 14/007,765

(22) PCT Filed: Sep. 7, 2011

(86) PCT No.: PCT/JP2011/005027
§ 371 (c)(1),
(2), (4) Date: Sep. 26, 2013

(87) PCT Pub. No.: WO2012/131797
PCT Pub. Date: Oct. 4, 2012

(65) Prior Publication Data
US 2014/0018990 A1  Jan. 16, 2014

(30) Foreign Application Priority Data
Mar. 28, 2011  (JP) ................. 2011-071149

(51) Int. Cl.
*G08B 21/00* (2006.01)
*B60Q 1/00* (2006.01)
(Continued)

(52) U.S. Cl.
CPC .......... *B60L 11/1864* (2013.01); *B60L 3/0046* (2013.01); *B60L 11/1851* (2013.01);
(Continued)

(58) Field of Classification Search
CPC ................. G01R 19/16542; G01R 31/3648; G01R 31/3658; G01R 31/3682; G01R 31/362; G01R 31/006; G01R 31/3655; G01R 31/3675; G01R 15/04; G01R 31/3624; G01R 31/3693; G01R 19/155; G01R 19/16519; G01R 19/16538; G01R 19/16571; G01R 1/0408; G01R 31/007; G01R 31/3644; G01R 31/3662; G01R 31/3665; G01R 31/3668; G01R 31/3679; G01R 31/3689; G01R 35/005; Y10S 320/21; Y10S 320/13; Y10S 320/12; Y10S 320/19; Y10S 307/625; Y10S 307/615; Y10S 307/469; Y10S 307/858; Y10S 307/944; H01M 10/48; H01M 10/44; H01M 10/425; H01M 10/46; H01M 10/345; H01M 10/488; H01M 2/34; H01M 2/348; H01M 10/4207; H01M 10/482; H01M 10/486; H01M 16/00; H01M 2/1044; H01M 2/20; H01M 6/5033; H01M 6/5044; H01M 6/505; H02J 7/0031; H02J 7/0047; H02J 7/1461; H02J 7/0019; H02J 7/0073; H02J 9/061; H02J 2007/005; H02J 2009/067; H02J 7/0004; H02J 7/0011; H02J 7/0013; H02J 7/0016; H02J 7/0018; H02J 7/0022; H02J 7/0026; H02J 7/0054; H02J 7/0077; H02J 7/008; H02J 7/1438; H02J 9/062; H02H 7/18; H02H 1/06; H02H 3/207; Y02T 10/7005; Y02T 10/6269; Y02T 10/7016; Y02T 10/7044; Y02T 10/705; Y02T 10/7055; Y02T 10/7061; B60R 16/03; B60T 2270/414; B60W 2510/244; G04C 10/04; G06F 1/3203; G06F 1/30; G03B 7/26
USPC ............ 340/636.1, 635, 636.19, 455, 636.15
See application file for complete search history.

(56) References Cited

U.S. PATENT DOCUMENTS 6,791,464 B2 * 9/2004 Huang ............. G01R 19/16542
                                                      324/433
2003/0015995 A1 * 1/2003 Tamura et al. ................ 320/162
(Continued)

FOREIGN PATENT DOCUMENTS
JP      8-182029          7/1996
(Continued)

OTHER PUBLICATIONS
International Search Report issued Dec. 13, 2011 in International Application No. PCT/JP2011/005027.

*Primary Examiner* — Emily C Terrell
(74) *Attorney, Agent, or Firm* — Wenderoth, Lind & Ponack, L.L.P.

(57) ABSTRACT

A battery ECU provides an N-th arithmetic processing device with an ID assignment signal. The N-th arithmetic processing device receives the ID assignment signal, and stores an ID that is transmitted by the battery ECU. The battery ECU provides an i-th arithmetic processing device (i is a natural number from N to 2) with a command for providing an ID assignment signal. The i-th arithmetic processing device provides the (i−1)-th arithmetic processing device with the ID assignment signal in response to the command for providing an ID assignment signal. The (i−1)-th arithmetic processing device receives the ID assignment signal, and stores an ID that is transmitted by the battery ECU.

6 Claims, 12 Drawing Sheets

(51) Int. Cl.
  *B60L 11/18* (2006.01)
  *H02J 7/00* (2006.01)
  *G01R 31/36* (2006.01)
  *B60L 3/00* (2006.01)
  *H04Q 9/00* (2006.01)
  *H01M 10/42* (2006.01)

(52) U.S. Cl.
  CPC ............. *G01R31/36* (2013.01); *H02J 7/0021* (2013.01); *H02J 7/0029* (2013.01); *H04Q 9/00* (2013.01); *H01M 10/4207* (2013.01); *H01M 2010/4278* (2013.01); *H01M 2220/20* (2013.01); *H02J 2007/0098* (2013.01); *H04Q 2209/30* (2013.01); *Y02T 10/7005* (2013.01); *Y02T 10/7055* (2013.01); *Y02T 10/7061* (2013.01); *Y02T 90/16* (2013.01)

(56) References Cited

U.S. PATENT DOCUMENTS

| | | | |
|---|---|---|---|
| 2005/0110460 A1* | 5/2005 | Arai | B60L 3/0046 320/116 |
| 2006/0020372 A1 | 1/2006 | Watabe | |
| 2006/0028179 A1* | 2/2006 | Yudahira et al. | 320/133 |
| 2009/0085516 A1* | 4/2009 | Emori | B60L 3/0046 320/118 |
| 2010/0052428 A1 | 3/2010 | Imamura et al. | |
| 2010/0185405 A1* | 7/2010 | Aoshima et al. | 702/63 |
| 2010/0248008 A1* | 9/2010 | Sugawara et al. | 429/159 |

FOREIGN PATENT DOCUMENTS

| | | |
|---|---|---|
| JP | 2003-79059 | 3/2003 |
| JP | 2005-341386 | 12/2005 |
| JP | 2007-295774 | 11/2007 |
| JP | 2010-61939 | 3/2010 |

\* cited by examiner

BATTERY SYSTEM, ELECTRIC VEHICLE, MOBILE UNIT, ELECTRIC POWER STORAGE DEVICE AND POWER SUPPLY DEVICE

BACKGROUND OF THE INVENTION

1. Field of the Invention

The present invention relates to a battery system, and an electric vehicle, a mobile unit, an electric power storage device and a power supply device that include the battery system.

2. Description of the Related Art

In order to serve as a power source or electric power storage device for mobile units such as electric car, battery systems include a plurality of rechargeable battery modules. Each of the battery modules includes a plurality of batteries (battery cells) that are connected in series to each other, for example. Also, battery systems include a detection device that can detect abnormal conditions such overcharged and overdischarged conditions of battery cells.

A vehicle battery pack control device disclosed in Japanese Patent Laid-Open Publication No. JP 2003-79,059 A includes a plurality of simple cell-overcharge-and-overdischarge detection devices that are assigned to a plurality of cell groups in the battery pack. Each cell-overcharge-and-overdischarge detection device can determine whether the corresponding cell group is brought into an overcharged or overdischarged condition, and transmit the result to a battery controller.

SUMMARY OF THE INVENTION

In order that the plurality of simple cell-overcharge-and-overdischarge detection devices can communicate with the battery controller in the vehicle battery pack control device disclosed in JP 2003-79,059 A, it is necessary to uniquely assign identifiers (IDs) to the plurality of simple cell-overcharge-and-overdischarge detection devices. Accordingly, identifiers are assigned to the plurality of simple cell-overcharge-and-overdischarge detection devices in production of the vehicle battery pack control device.

Japanese Laid-Open Patent Publication No. JP H08-182,029 A (1996) disclosed a connection method for systems. The connection method for systems disclosed in JP H08-182,029 A includes a plurality of devices that include conversion circuits. The conversion circuits of the plurality of devices are cascaded through signal lines. If the conversion circuit of one of the devices receives a signal indicating an identification number "1", this device is identified as "1" by this conversion circuit, while this conversion circuit transmits a signal indicating an identification number "2" to the conversion circuit of other one of the devices through the signal line, for example. If this conversion circuit of the other one of the devices receives a signal indicating an identification number "2", this device is identified as "2" by this conversion circuit, while this conversion circuit transmits a signal indicating an identification number "3" to the conversion circuit of still other one of the devices through the signal line, for example. Thus, identification numbers can be assigned to the plurality of devices one after another.

However, when the vehicle battery pack control device is to be used, if one of the simple cell-overcharge-and-overdischarge detection devices develops trouble, it is necessary to replace this simple cell-overcharge-and-overdischarge detection device with a new simple cell-overcharge-and-overdischarge detection device. In this case, it is difficult for users to provide the new simple cell-overcharge-and-overdischarge detection device with a unique identifier that is different from the other simple cell-overcharge-and-overdischarge detection devices.

In JP H08-182,029 A, a controller is not provided which can communicate with the plurality of devices. For this reason, in the case where the vehicle battery pack control device disclosed in JP H08-182,029 A is adopted to a communications system including a controller and a plurality of devices that communicate with each other, the controller cannot determine whether identification numbers are assigned to all the devices. Also, the controller cannot assign desired identification numbers, and the like. Accordingly, communication reliability cannot be ensured.

It is an object of the present invention to provide a battery system, an electric vehicle, a mobile unit, an electric power storage device, and a power supply device that can ensure communication reliability and provide easy identifier assignment.

A battery system according to the present invention includes a control device; and 1st to N-th battery modules. Each of the battery modules includes a battery cell group, a voltage detection portion, a processing device, an abnormality detection portion, and a selection portion. The battery cell group includes one or a plurality of battery cells. The voltage detection portion is arranged corresponding to the battery cell group, and detects voltages of the battery cells in the battery cell group. The processing device transmits the detection result detected by the voltage detection portion to the control device, and provides an assignment signal as a command for storing an identifier. The abnormality detection portion can detect overcharge or overdischarge abnormal conditions of the battery cell group, and issue a detection signal indicating the abnormal conditions. The selection portion selectively provides one of the assignment signal, which is provided from the processing device, and the detection signal, which is issued by the abnormality detection portion. The control device and the processing devices of the battery modules are connected to each other through a communication line. The processing devices of 1st to N-th battery modules can be defined as 1st to N-th processing devices. The control device is connected to the N-th processing device through a first signal line. The selection portion of the i-th (i is a natural number from N to 2) battery module is connected to the abnormality detection portion and the processing device of the (i−1)-th battery module through a second signal line. The selection portion of the 1st battery module is connected to the control device through a third signal line. In an identifier assignment mode, the control device provides the N-th processing device with an N-th assignment signal as a command for storing an identifier through the first signal line, and then transmits an identifier of the N-th processing device through the communication line. In addition, the control device provides with the i-th processing device a command for providing an (i−1)-th assignment signal to the (i−1)-th processing device, and then transmits an identifier of the (i−1)-th processing device through the communication line in order from the N-th to 2nd processing devices. When the i-th processing device receives the i-th assignment signal, the i-th processing device stores the identifier of the i-th processing device, which is transmitted by the control device, and provides the (i−1)-th processing device with the (i−1)-th assignment signal in response to the command for providing an (i−1)-th assignment signal, and the selection portion of the i-th battery module provides the (i−1)-th processing device with the (i−1)-th assignment signal, which is provided from the i-th processing device, through the second signal line. When the 1st processing device receives the 1st assignment signal, the 1st processing device stores the identifier of the 1st processing device that is transmitted by the master device. In a normal mode, the selection portion of the i-th battery module provides the (i−1)-th abnormality detection portion with the detection signal, which is issued by the i-th abnormality detection portion, through the second signal line, and the selection portion of the 1st battery module provides the control device with the detection signal, which is issued by the 1st abnormality detection portion, through the third signal line.

According to the present invention, it is possible to ensure communication reliability and provide easy identifier assignment.

The above and further objects of the present invention as well as the features thereof will become more apparent from the following detailed description to be made in conjunction with the accompanying drawings.

DETAILED DESCRIPTION OF THE INVENTION

[1] Battery System

The following description will describe a battery system according to an embodiment of the present invention with reference to the drawings. The battery system according to this embodiment is installed on an electric vehicle (e.g., electric car). The battery system as power source supplies electric power to the electric vehicle. The battery system can be also used for electric power storage devices or consumer products that include a plurality of rechargeable battery cells.

(1) Construction of Battery System

Figure 1:
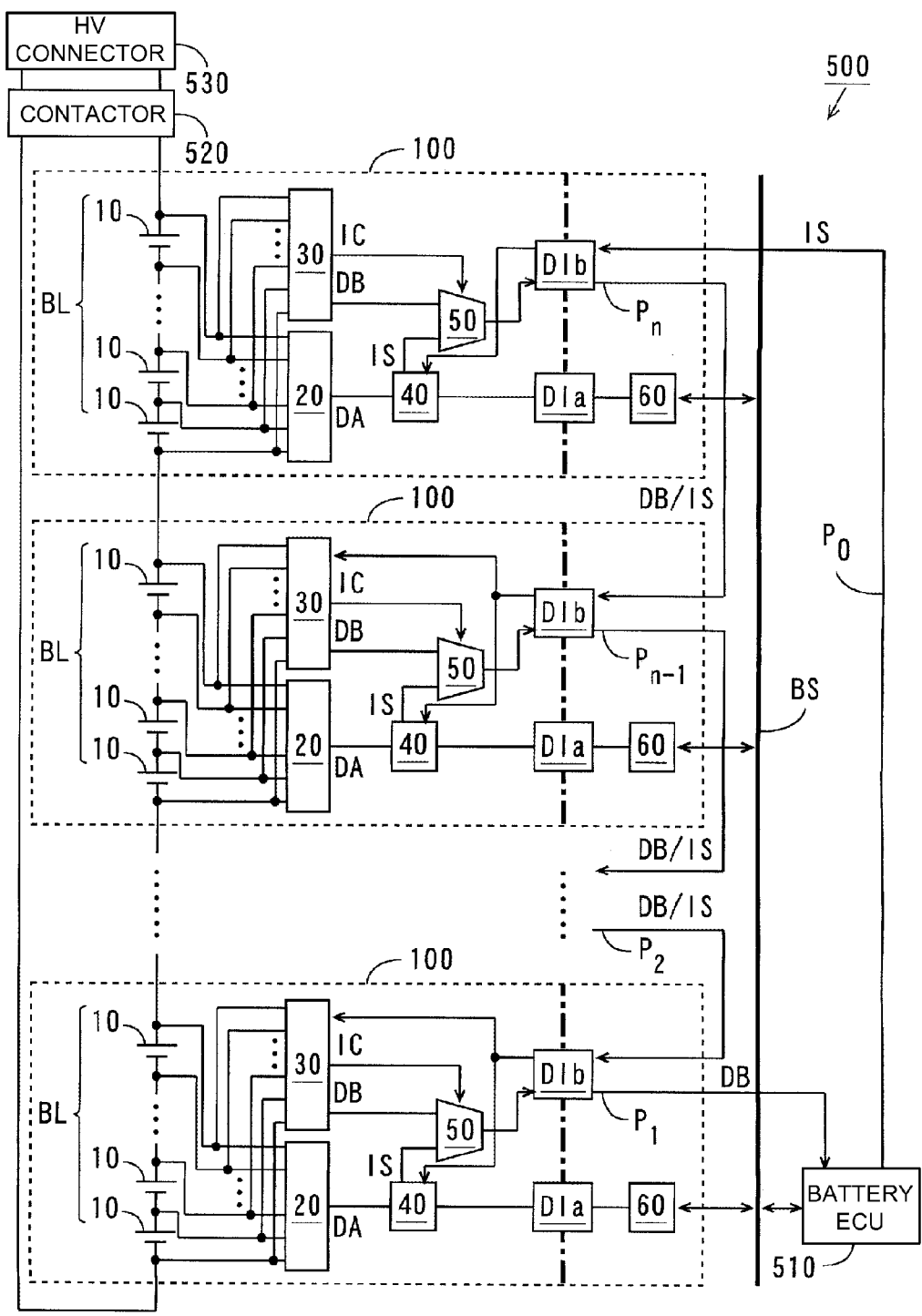
FIG. 1 is a block diagram showing the construction of a battery system according to one embodiment of the present invention.

FIG. 1 is a block diagram showing the construction of the battery system according to the embodiment of the present invention. As shown in FIG. 1, the battery system 500 includes a plurality of battery modules 100, a battery ECU (Electronic Control Unit) 510, a contactor 520, and an HV (High Voltage) connector 530. In this embodiment, the number of the battery modules 100 included in the battery system 500 is defined as N. N is a natural number not smaller than 2.

Each of the battery modules 100 includes a battery cell group BL that includes two or more battery cells 10, a voltage detection portion 20, an abnormality detection portion 30, an arithmetic processing device 40, a switching circuit 50, a communication driver 60, and insulating elements DIa and DIb. The battery cells 10 in the battery cell group BL are connected in series to each other. The battery cell groups BL are arranged adjacent to each other, and are integrally held as a battery block. A plurality of thermistors TH (discussed below with reference to FIG. 11) for detecting temperature are attached onto the battery cell groups BL. For example, the battery cells 10 are rechargeable batteries such as lithium ion batteries or nickel metal hydride batteries.

The battery cell groups BL of the plurality of battery modules 100 are connected in series to each other through a source line. Thus, in the battery system 500, all the battery cells 10 in the plurality of battery modules 100 are connected in series to each other.

In the following description, the battery modules from the battery module 100 that includes the battery cell 10 corresponding to the lowest potential to the battery module 100 that includes the battery cell 10 corresponding to the highest potential shown in FIG. 1 are referred to as 1st to N-th battery modules 100. The 2nd to (N−2)-th battery modules 100 are omitted for the sake of brevity in FIG. 1.

(2) Normal Mode

The arithmetic processing device 40 of each of the battery modules 100 can be selectively brought in a normal mode or an ID (identifier) assignment mode. The operations of portions in each of the battery modules 100 in the normal mode are now described.

The voltage detection portion 20 detects terminal voltages of the battery cells 10, and provides the arithmetic processing device 40 with detection signals DA that indicate the values of the detected terminal voltages. As abnormal charge/discharge conditions of the corresponding battery cell group BL, the abnormality detection portion 30 detects abnormal terminal voltage conditions of the battery cells 10. In order to prevent that the battery cells 10 are overdischarged or overcharged, an allowable voltage range of terminal voltage is prescribed. The abnormality detection portion 30 detects whether the terminal voltage of each of the battery cells 10 is lower than the upper limit of the allowable voltage range (hereinafter, referred to as the upper limit voltage), and whether the terminal voltage of each of the battery cells is higher than the lower limit of the allowable voltage range (hereinafter, referred to as the lower limit voltage).

When determining that the terminal voltage of at least one battery cell 10 of the corresponding battery cell group BL is not lower than the upper limit voltage or not higher than the lower limit voltage (when an abnormal condition is detected), the abnormality detection portion 30 issues a detection signal DB that has a first duty ratio (e.g., 75%).

When determining that the terminal voltages of all the battery cell 10 of the corresponding battery cell group BL fall within the allowable voltage range (in the normal condition is detected), the abnormality detection portion 30 issues a detection signal DB that has a second duty ratio (e.g., 25%). The abnormality detection portion 30 provides the issued detection signal DB to the switching circuit 50. In addition, the abnormality detection portion 30 provides a status signal IC. The state signal IC is set "H" level in the case where the abnormality detection portion 30 operates. In this case, the switching circuit 50 provides the insulating element DIb with the detection signal DB, which is issued by the abnormality detection portion 30. The state signal is set "L" level when the abnormality detection portion 30 stops operating.

The arithmetic processing device 40 communicates with the battery ECU 510 via the insulating element DIa and the communication driver 60 by using the CAN (Controller Area Network) standard, for example. According to this construction, the battery ECU 510 can easily communicate with the N arithmetic processing devices 40 in the broadcasting manner. A communication system is constructed of the N arithmetic processing devices 40 and the battery ECU 510. In this construction, the battery ECU 510 serves as a master device, while the arithmetic processing devices 40 serve as slave devices.

Figure 2:
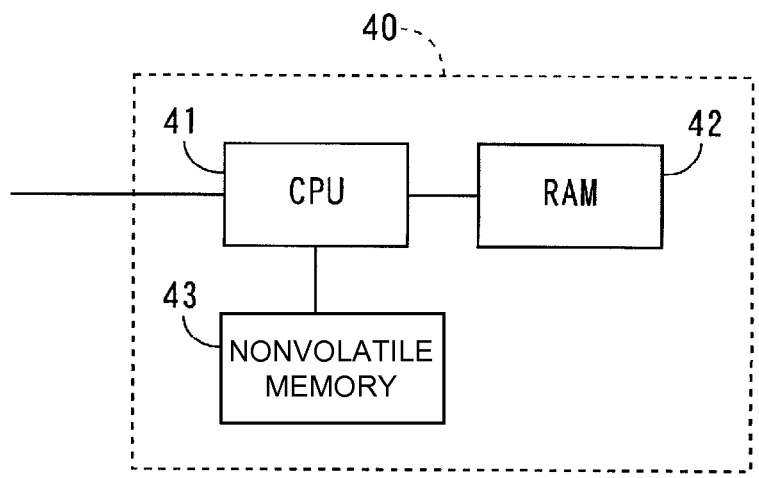
FIG. 2 is a block diagram showing the construction of an arithmetic processing device.

FIG. 2 is a block diagram showing the construction of the arithmetic processing device 40. As shown in FIG. 2, the arithmetic processing device 40 includes a CPU (Central Processing Unit) 41, a RAM (Random Access Memory) 42, and a nonvolatile memory 43. The arithmetic processing device 40 can be a microcomputer that includes the functions of the CPU 41, the RAM 42, and the nonvolatile memory 43.

An ID can be written into the RAM 42 in the ID assignment mode as discussed below. In addition, the nonvolatile memory 43 stores the ID, which is written into the RAM 42. The operation of the CPU 41 is now described as the operation of the arithmetic processing device 40.

The arithmetic processing device 40 can transmit the values of the terminal voltages of the battery cells 10 based on the detection signal DA that is provided from the voltage detection portion 20 to the battery ECU 510. Also, the arithmetic processing device 40 transmits the values of the temperatures of the battery modules 100, which are provided from the thermistors TH as discussed below with reference to FIG. 11, to the battery ECU 510. Also, the arithmetic processing device 40 performs various types of arithmetic computation and determination processes based on the values of the terminal voltages and the temperatures of the battery cells 10. Also, the arithmetic processing device 40 receives the various types of command signals from the battery ECU 510 through the bus BS and the communication driver 60.

In the ID assignment mode as discussed below, the arithmetic processing device 40 provides an ID assignment signal IS to the switching circuit 50 as discussed below. The switching circuit 50 selectively provides one of the detection signal DB, which is provided from the abnormality detection portion 30, and the ID assignment signal IS, which is provided from the arithmetic processing device 40, based on the status signal IC, which is provided from the abnormality detection portion 30. In the normal mode, the switching circuit 50 provides the insulating element DIb with the detection signal DB, which is provided by the abnormality detection portion 30. In the ID assignment mode as discussed below, the switching circuit 50 provides the insulating element DIb with the ID assignment signal IS, which is provided from the arithmetic processing device 40.

The battery ECU 510 is connected to the insulating element DIb in the N-th battery module 100 through a signal line $P_0$. The insulating element DIb in the N-th battery module 100 is connected to the (N−1)-th insulating element DIb through a signal line $P_n$. The insulating element DIb in the (N−1)-th battery module 100 is connected to the (N−2)-th insulating element DIb through a signal line $P_{n-1}$. Similarly, the insulating element DIb in the 2nd battery module 100 is connected to the 1st insulating element DIb through a signal line $P_2$. The insulating element DIb of the 1st battery module 100 is connected to the battery ECU 510 through a signal line $P_1$.

Thus, the battery ECU 510 and the 1st to N-th battery modules 100 are connected to each other through the signal line $P_0$ to $P_n$. Note that the signal line $P_0$ is not used in the normal mode.

In the normal mode, the detection signal DB that is issued by the abnormality detection portion 30 in the N-th battery module 100 is provided through the switching circuit 50, the insulating element DIb, the signal line $P_n$ and the insulating element DIb in the (N−1)-th battery module 100 to the abnormality detection portion 30 in the (N−1)-th battery module 100. The detection signal DB that is issued by the abnormality detection portion 30 in the (N−1)-th battery module 100 is provided through the switching circuit 50, the insulating element DIb, the signal line $P_{n-1}$ and the insulating element DIb in the (N−2)-th battery module 100 to the abnormality detection portion 30 in the (N−2)-th battery module 100.

Similarly, the detection signal DB that is issued by the abnormality detection portion 30 in the 2nd battery module 100 is provided through the switching circuit 50, the insulating element DIb, the signal line $P_2$ and the insulating element DIb in the 1st battery module 100 to the abnormality detection portion 30 in the 1st battery module 100. The detection signal DB that is issued by the abnormality detection portion 30 in the 1st battery module 100 is provided through the switching circuit 50, the insulating element DIb and the signal line $P_1$ to the battery ECU 510.

Figure 3:
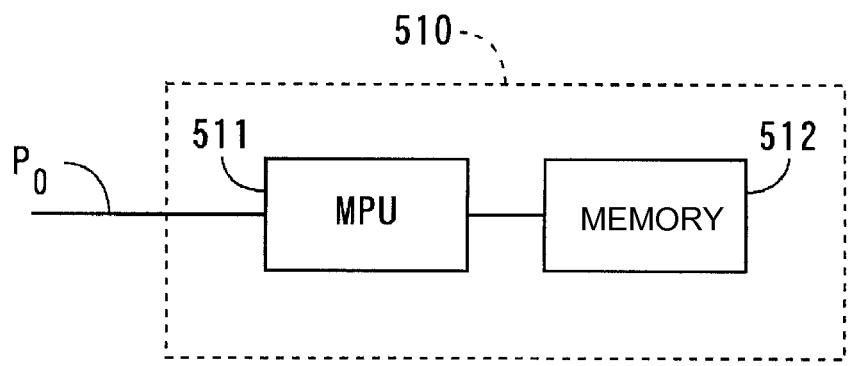
FIG. 3 is a block diagram showing the construction of a battery ECU.

FIG. 3 is a block diagram showing the construction of the battery ECU 510. As shown in FIG. 3, the battery ECU 510 includes an MPU (microprocessor) 511, and a memory 512. The memory 512 stores programs for the normal and ID assignment modes. The MPU 511 operates based on the programs stored in the memory 512. The operation of the MPU 511 is now described as the operation of the battery ECU 510.

The battery ECU 510 calculates charged amounts of the battery cells 10 based on the values of the terminal voltages of the battery cells 10 that are provided from the arithmetic processing devices 40 of the battery modules 100. Also, the battery ECU 510 detects abnormal charge/discharge conditions of the battery cell groups BL in the battery modules 100 based on the values of the terminal voltages and temperatures of the battery cells 10, which are provided from the arithmetic processing devices 40 of the battery modules 100. For example, the abnormal charge/discharge conditions of the battery cell group BL in the battery module 100 include abnormalities in electric current in the battery cell group BL, terminal voltage, SOC (charged amount), overdischarge, overcharge, temperature of battery cell 10, and the like.

In addition, the battery ECU 510 detects abnormal terminal voltage conditions of the battery cells 10 of the battery modules 100 based on the detection signals DB that are provided from the 1st battery module 100.

The contactor 520 is connected to power source lines that are connected to the highest potential positive terminal of the N-th battery module 100 and the lowest potential negative terminal of the 1st battery module 100. Also, the contactor 520 is connected to a load such as electric motor of electric vehicle through the HV connector 530. The battery ECU 510 turns off the contactor 520 if the battery module 100 is brought into an abnormal condition. According to this construction, since electric current does not flow through the battery cells 10 in case of abnormal conditions, it is possible to prevent abnormal heat generation in the battery module 100.

The battery ECU 510 is connected to a main control portion 300 (discussed below with reference to FIG. 12) of the electric vehicle through the bus. The battery ECU 510 provides the main control portion 300 with charged amounts of the battery modules 100 (charged amounts of the battery cells 10). The main control portion 300 controls power (e.g., rotational speed of electric motor) of the electric vehicle based on the charged amounts. Also, if the charged amounts of the battery modules 100 become low, the main control portion 300 controls an electric generator (not shown) that is connected to the power source lines so that the battery modules 100 can be charged.

(3) Construction of Voltage Detection Portion and Abnormality Detection Portion

Figure 4:
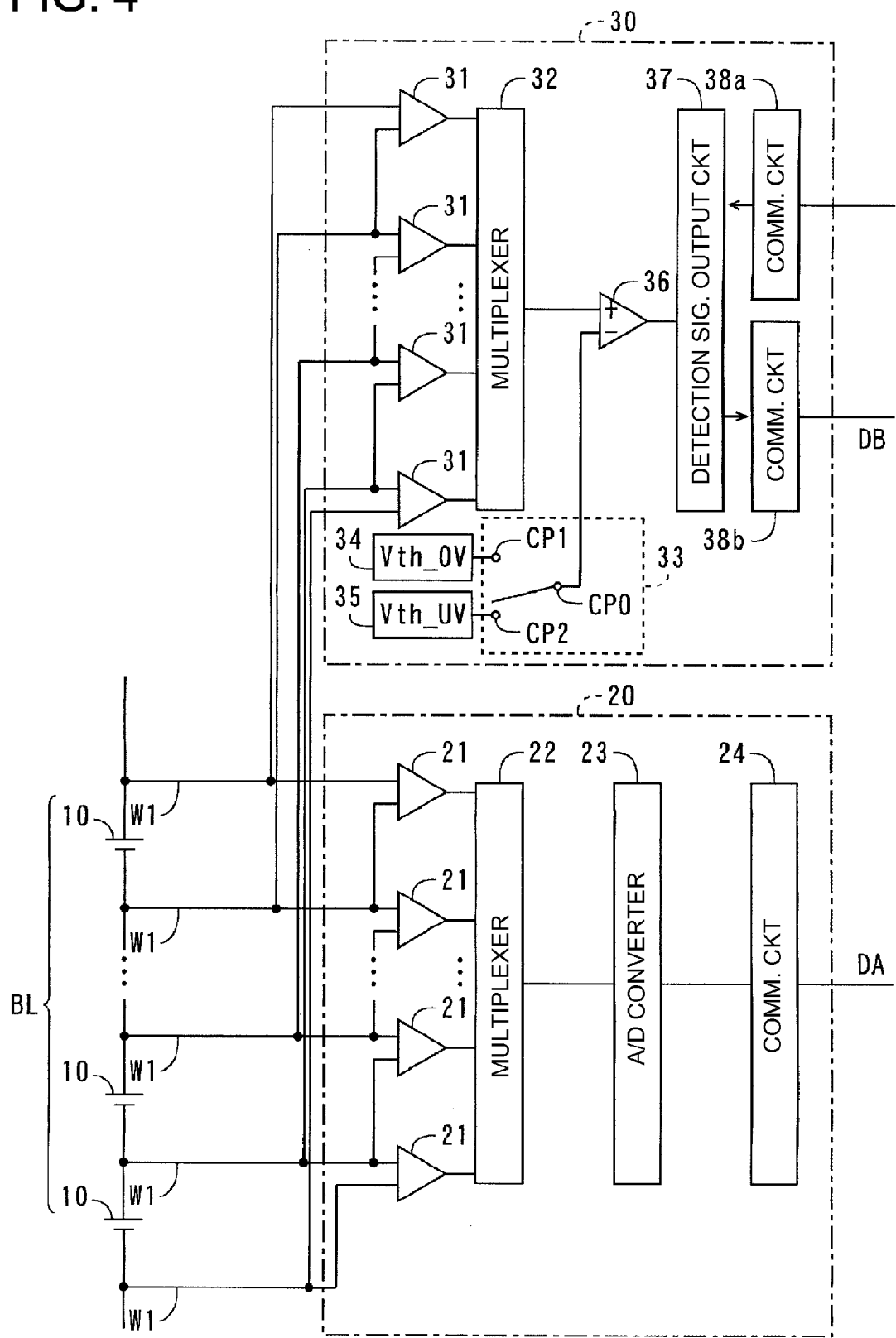
FIG. 4 is a block diagram showing the construction of a voltage detection portion and an abnormality detection portion.

FIG. 4 is a block diagram showing the construction of the voltage detection portion 20 and the abnormality detection portion 30. The voltage detection portion 20 is constructed of ASIC (Application Specific Integrated Circuit), for example. The voltage detection portion 20 includes a plurality of differential amplifiers 21, a multiplexer 22, an A/D (analog/digital) converter 23, and a communication circuit 24. Note that a signal output circuit for providing the status signal IC in FIG. 1 is not shown in FIG. 4.

Each of the differential amplifiers 21 includes two input terminals and an output terminal. The differential amplifier 21 amplifies the voltage difference between two voltages provided to the two input terminals, and provides the amplified voltage difference from the output terminal. The two input terminals of each of the differential amplifiers 21 are connected to the positive and negative terminals of the battery cell 10 corresponding to conductor wire lines W1. According to this construction, each of the differential amplifiers 21 amplifies the voltage difference between the positive and negative terminals of the corresponding battery cell 10. The output voltage of the differential amplifier 21 corresponds to the terminal voltage of the corresponding battery cell 10. The multiplexer 22 is provided with the terminal voltages, which are provided from the differential amplifiers 21. The multiplexer 22 selectively provides the A/D convertor 23 with the terminal voltages, which are provided from the differential amplifiers 21, one after another.

The A/D convertor 23 converts the terminal voltages, which are provided from the multiplexer 22, into digital values. The arithmetic processing device 40 (see FIG. 1) is provided with the digital values, which are obtained by the A/D convertor 23, as the detection signals DA for indicating the values of the terminal voltages through the communication circuit 24.

The abnormality detection portion 30 is constructed of ASIC, for example. The abnormality detection portion 30 includes a plurality of differential amplifiers 31, a multiplexer 32, a switching circuit 33, reference voltage output portions 34 and 35, a comparator 36, a detection signal output circuit 37, and communication circuits 38a and 38b.

Each of the differential amplifiers 31 includes two input terminals and an output terminal. The differential amplifier 31 amplifies the voltage difference between two voltages provided to the two input terminals, and provides the amplified voltage difference from the output terminal. The two input terminals of each of the differential amplifiers 31 are connected to the positive and negative terminals of the battery cell 10 corresponding to conductor wire lines W1. According to this construction, each of the differential amplifiers 31 amplifies the voltage difference between the positive and negative terminals of the corresponding battery cell 10. The output voltage of the differential amplifier 31 corresponds to the terminal voltage of the corresponding battery cell 10. The multiplexer 32 is provided with the terminal voltages, which are provided from the differential amplifiers 31. The multiplexer 32 selectively provides the comparator 36 with the terminal voltages, which are provided from the differential amplifiers 31, one after another.

The switching circuit 33 includes terminals CP0, CP1, and CP2. The reference voltage output portion 34 provides an upper limit voltage Vth_O to the terminal CP1 of the switching circuit 33. The reference voltage output portion 35 provides a lower limit voltage Vth_U to the output terminal CP2. For example, the upper limit voltage Vth_O can be set at 4.2 V (not lower than 4.19 V and not higher than 4.21 V), while the lower limit voltage Vth_U can be set at approximately 2.0 V (not lower than 1.99 V and not higher than 2.01 V).

Each of the comparators 36 includes two input terminals and an output terminal. One of the input terminals of the comparator 36 is connected to the multiplexer 32. Another of the input terminals of the comparator 36 is connected to the terminal CP0 of the switching circuit 33. The switching circuit 33 alternately connects the terminal CP0 to the terminals CP1 and CP2 at a predetermined period. The one of the input terminals of the comparator 36 is provided with the terminal voltage that is provided from the multiplexer 32, while the another of the input terminals of the comparator 36 is alternately provided with the upper limit voltage Vth_O and the lower limit voltage Vth_U. In this case, the comparator 36 alternately compares the upper limit voltage Vth_O and the lower limit voltage Vth_U with the terminal voltage of the battery cell 10 that is provided from the multiplexer 32, and provides the detection signal output circuit 37 with a signal for indicating the comparison result.

The detection signal output circuit 37 determines whether the terminal voltages of any of the battery cells 10 is lower than the upper limit voltage Vth_O based on output signals of the comparator 36, and whether the terminal voltages of any of the battery cells 10 is higher than the lower limit voltage Vth_U.

If the terminal voltages of any of the battery cells 10 not is lower than the upper limit voltage Vth_O or is not higher than the lower limit voltage Vth_U, the detection signal output circuit 37 determines that the corresponding battery cell group BL is in an abnormal terminal voltage condition. If the terminal voltages of all the battery cells 10 are lower than the upper limit voltage Vth_O and is higher than the lower limit voltage Vth_U, the detection signal output circuit 37 determines that the corresponding battery cell group BL is in the normal terminal voltage condition.

The detection signal is not provided to the communication circuit 38a in the N-th battery module 100. When it is determined that the corresponding battery cell group BL is in an abnormal terminal voltage condition, the detection signal output circuit 37 issues a detection signal DB that has a first duty ratio (e.g., 75%). When determining that the corresponding battery cell group BL is in the normal terminal voltage condition, the detection signal output circuit 37 issues the detection signal DB that has a second duty ratio (e.g., 25%). The communication circuit 38$b$ provides the abnormality detection portion 30 of the (N−1)-th battery module 100 with the detection signal DB, which is issued by the detection signal output circuit 37, through the switching circuit 50, the insulating element DIb and the signal line $P_n$.

The construction of the voltage detection portion 20 and the abnormality detection portion 30 in the i-th battery module (i is any natural number of 2 to (N−1)) 100 is similar to the construction and operation of the voltage detection portion 20 and the abnormality detection portion 30 in the N-th battery module 100 except for the following points.

The communication circuit 38$a$ in the i-th battery module 100 provides the detection signal output circuit 37 with the detection signal DB that is provided from the (i+1)-th battery module 100. When it is determined that the corresponding battery cell group BL is in an abnormal terminal voltage condition or when the detection signal that is provided from the communication circuit 38$a$ contains the first duty ratio (e.g., 75%), the detection signal output circuit 37 issues a detection signal DB that has the first duty ratio (e.g., 75%). When it is determined that the corresponding battery cell group BL is in the normal terminal voltage condition or when the detection signal that is provided from the communication circuit 38$a$ contains the second duty ratio (e.g., 25%), the detection signal output circuit 37 issues the detection signal DB that has the second duty ratio (e.g., 25%). The communication circuit 38$b$ provides the (i−1)-th battery module 100 with the detection signal DB that is issued by the detection signal output circuit 37.

The construction of the voltage detection portion 20 and the abnormality detection portion 30 in the 1st battery module 100 is similar to the construction and operation of the voltage detection portion 20 and the abnormality detection portion 30 in the i-th battery module 100 except for the following points. The communication circuit 38$b$ in the 1st battery module 100 provides the battery ECU 510 through the signal line $P_1$ with the detection signal DB that is issued by the detection signal output circuit 37.

When it is determined that all the battery cells 10 in the battery modules are in the normal terminal voltage condition, the battery ECU 510 obtains the detection signal DB that has the first duty ratio (e.g., 75%) from the 1st battery module 100. On the other hand, when it is determined that any of the battery cells 10 in the battery modules is in an abnormal terminal voltage condition, the battery ECU 510 obtains the detection signal DB that has the second duty ratio (e.g., 25%) from the 1st battery module 100. Accordingly, the battery ECU 510 can detect abnormal terminal voltage conditions of the battery cells 10 in the battery modules 100.

(4) Another Exemplary Construction of Voltage Detection Portion and Abnormality Detection Portion In the case where the battery module 100 includes a number of battery cells 10 in the battery cell group BL, or in the case where the voltage detection portion 20 or the abnormality detection portion 30 has low breakdown voltage, the battery module 100 may include a plurality of voltage detection portions 20 that are connected in series to each other and a plurality of abnormality detection portions 30 that are connected in series to each other.

Figure 5:
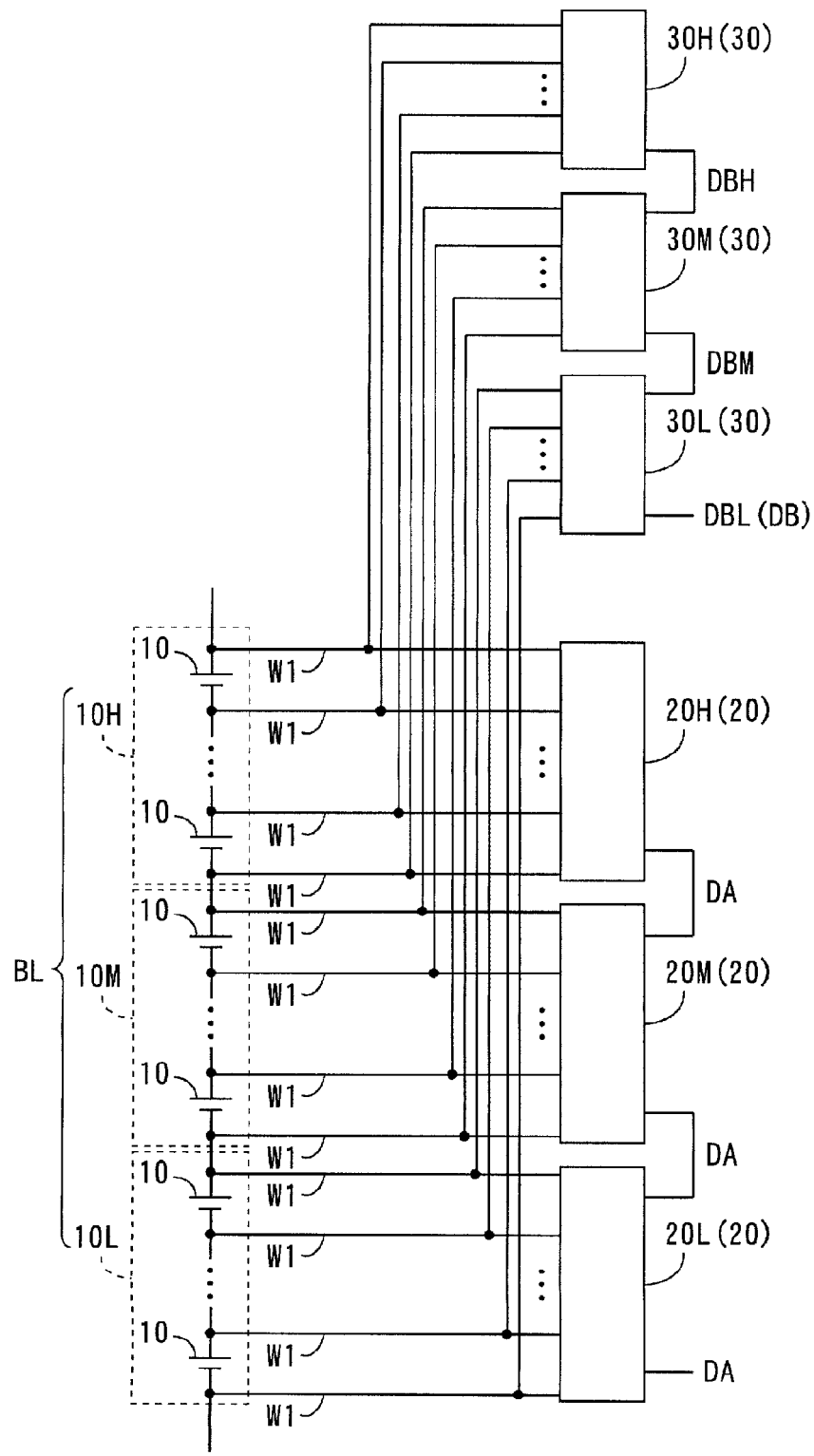
FIG. 5 is a block diagram showing the construction of battery modules each of which includes a plurality of voltage detection portions and a plurality of abnormality detection portions.

FIG. 5 is a block diagram showing the construction of battery modules 100 each of which includes the plurality of voltage detection portions 20 and the plurality of abnormality detection portions 30. The construction of the battery module 100 is shown in FIG. 5. The battery module 100 according to an embodiment shown in FIG. 5 includes three voltage detection portions 20 and three abnormality detection portions 30.

One of the voltage detection portions 20 (hereinafter, referred to as lower potential voltage detection portion 20L) corresponds to one-third of the number of the plurality of battery cells 10 (hereinafter, referred to as lower potential battery cell group 10L) that are connected on the lower potential side. Another of the voltage detection portions 20 (hereinafter, referred to as middle potential voltage detection portion 20M) corresponds to another one-third of the number of the plurality of battery cells 10 (hereinafter, referred to as middle potential battery cell group 10M) that are connected on the middle potential part. Also, the other of the voltage detection portions 20 (hereinafter, referred to as higher potential voltage detection portion 20H) corresponds to the other one-third (six in this embodiment) of the number of the plurality of battery cells 10 (hereinafter, referred to as higher potential battery cell group 10H) that are connected on the higher potential side.

The lower potential voltage detection portion 20L detects the terminal voltages of the battery cells 10 in the lower potential battery cell group 10L. The middle potential voltage detection portion 20M detects the terminal voltages of the battery cells 10 in the middle potential battery cell group 10M. The higher potential voltage detection portion 20H detects the terminal voltage of the battery cells 10 in the higher potential battery cell group 10H.

The detection signal DA that is provided from the communication circuit 24 (see FIG. 4) in the higher potential voltage detection portion 20H is provided through the communication circuit 24 (see FIG. 4) in the middle potential voltage detection portion 20M to the communication circuit 24 (see FIG. 4) in the lower potential voltage detection portion 20L, and is then provided to the arithmetic processing device 40 from the communication circuit 24 in the lower potential voltage detection portion 20L. The detection signal DA that is provided from the communication circuit 24 in the middle potential voltage detection portion 20M is provided to the communication circuit 24 in the lower potential voltage detection portion 20L, and is then provided to the arithmetic processing device 40 from the communication circuit 24 in the lower potential voltage detection portion 20L. The detection signal DA that is provided from the communication circuit 24 in the lower potential voltage detection portion 20L is provided to the arithmetic processing device 40.

One of the abnormality detection portions 30 (hereinafter, referred to as lower potential abnormality detection portion 30L) corresponds to the lower potential battery cell group 10L. Another of the abnormality detection portions 30 (hereinafter, referred to as middle potential abnormality detection portion 30M) correspond to the middle potential battery cell group 10M. The other of the abnormality detection portions 30 (hereinafter, referred to as higher potential abnormality detection portion 30H) corresponds to the higher potential battery cell group 10H.

The lower potential abnormality detection portion 30L detects abnormal conditions of the battery cells 10 in the lower potential battery cell group 10L. The middle potential abnormality detection portion 30M detects abnormal conditions of the battery cells 10 in the middle potential battery cell group 10M. The higher potential abnormality detection portion 30H detects abnormal conditions of the battery cells 10 in the higher potential battery cell group 10H.

In this embodiment, the communication circuit 38b (see FIG. 4) in the higher potential abnormality detection portion 30H is connected to the communication circuit 38a (see FIG. 4) in the middle potential abnormality detection portion 30M. The communication circuit 38b (see FIG. 4) in the middle potential abnormality detection portion 30M is connected to the communication circuit 38a (see FIG. 4) in the lower potential abnormality detection portion 30L. The communication circuit 38b (see FIG. 4) in the lower potential abnormality detection portion 30L is connected to the switching circuit 50 (see FIG. 1).

The detection signal DB is provided from the abnormality detection portion 30 (lower potential abnormality detection portion 30L) in the (i+1)-th battery module 100 to the higher potential abnormality detection portion 30H in the i-th battery module 100 (i is a natural number from 2 to (N−1)). In the higher potential abnormality detection portion 30H in the i-th battery module 100, when it is determined that the corresponding higher potential battery cell group 10H is in an abnormal terminal voltage condition or when the communication circuit 38a provides the detection signal DB that has the first duty ratio (e.g., 75%), the detection signal output circuit 37 (see FIG. 4) issues a detection signal DBH that has the first duty ratio (e.g., 75%). Also, when it is determined that the corresponding higher potential battery cell group 10H is in the normal terminal voltage condition and when the communication circuit 38a provides the detection signal DB that has the second duty ratio (e.g., 25%), the detection signal output circuit 37 issues the detection signal DBH that has the second duty ratio (e.g., 25%). The communication circuit 38b (see FIG. 4) provides the middle potential abnormality detection portion 30M with the detection signal DBH that is issued by the detection signal output circuit 37.

In the middle potential abnormality detection portion 30M, the communication circuit 38a (see FIG. 4) provides the detection signal output circuit 37 (see FIG. 4) with the detection signal DBH that is issued by the higher potential abnormality detection portion 30H. When it is determined that the corresponding middle potential battery cell group 10M is in an abnormal terminal voltage condition or when the communication circuit 38a provides the detection signal DBH that has the first duty ratio (e.g., 75%), the detection signal output circuit 37 issues a detection signal DBM that has the first duty ratio (e.g., 75%). Also, when it is determined that the corresponding middle potential battery cell group 10M is in the normal terminal voltage condition and when the communication circuit 38a provides the detection signal DBH that has the second duty ratio (e.g., 25%), the detection signal output circuit 37 issues the detection signal DBM that has the second duty ratio (e.g., 25%). The communication circuit 38b (see FIG. 4) provides the lower potential abnormality detection portion 30L with the detection signal DBM that is issued by the detection signal output circuit 37.

In the lower potential abnormality detection portion 30L, the communication circuit 38a (see FIG. 4) provides the detection signal output circuit 37 (see FIG. 4) with the detection signal DBM that is issued by the middle potential abnormality detection portion 30M. When it is determined that the corresponding lower potential battery cell group 10L is in an abnormal terminal voltage condition or when the communication circuit 38a provides the detection signal DBM that has the first duty ratio (e.g., 75%), the detection signal output circuit 37 issues a detection signal DBL that has the first duty ratio (e.g., 75%). Also, when it is determined that the corresponding lower potential battery cell group 10L is in the normal terminal voltage condition and when the communication circuit 38a provides the detection signal DBM that has the first duty ratio (e.g., 75%), the detection signal output circuit 37 issues the detection signal DBL of "L" level for indicating the normal condition, for example. The communication circuit 38b (see FIG. 4) provides the abnormality detection portion 30 (higher potential abnormality detection portion 30H) in the (i−1)-th battery module 100 with the detection signal DBL that is issued by the detection signal output circuit 37 as the detection signal DB.

The operation of the abnormality detection portion 30 in the N-th battery module 100 is similar to the operation of the abnormality detection portion 30 in the i-th battery module 100 except for the following points. The detection signal DB is not provided to the communication circuit 38a of the higher potential abnormality detection portion 30H in the N-th battery module 100. For this reason, in the higher potential abnormality detection portion 30H in the N-th battery module 100, when it is determined that the corresponding higher potential battery cell group 10H is in an abnormal terminal voltage condition, the detection signal output circuit 37 (see FIG. 4) issues the detection signal DBH that has a first duty ratio (e.g., 75%). Also, when determining that the higher potential battery cell group 10H is in the normal terminal voltage condition, the detection signal output circuit 37 issues the detection signal DBH that has a second duty ratio (e.g., 25%).

The operation of the abnormality detection portion 30 in the 1st battery module 100 is similar to the operation of the abnormality detection portion 30 in the i-th battery module 100 except for the following points. The communication circuit 38b (see FIG. 4) of the abnormality detection portion 30 in the 1st battery module 100 provides the battery ECU 510 with the detection signal DBL that is issued by the detection signal output circuit 37 as the detection signal DB.

(5) Exemplary Construction of Printed Circuit Board

Figure 6:
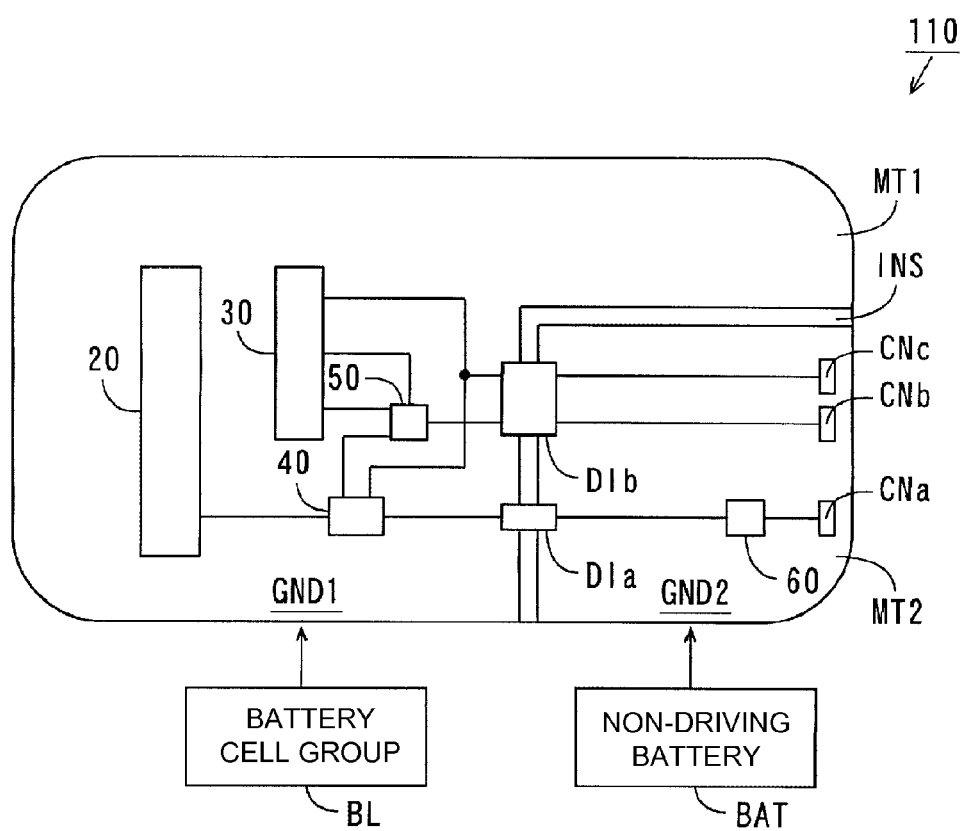
FIG. 6 is a plan view schematically showing an exemplary printed circuit board of the battery module.

The voltage detection portion 20, the abnormality detection portion 30, the arithmetic processing device 40, the switching circuit 50, the communication driver 60, and the insulating elements DIa and DIb in each of the battery module 100 shown in FIG. 1 are mounted on a rigid printed circuit board (hereinafter, referred to as printed circuit board). FIG. 6 is a plan view schematically showing an exemplary printed circuit board of the battery module 100. As shown in FIG. 6, in addition, connectors CNa, CNb, and CNc are mounted on the printed circuit board 110. Also, the printed circuit board 110 includes first and second mounting regions MT1 and MT2, and a belt-shaped insulating region INS.

The second mounting region MT2 is formed in one corner part of the printed circuit board 110. The insulating region INS extends along the second mounting region MT2. The first mounting region MT1 is formed in the other part of the printed circuit board 110. The first and second mounting regions MT1 and MT2 are separated from each other by the insulating region INS. Theus, the first and second mounting regions MT1 and MT2 are electrically insulated from each other by the insulating region INS.

The voltage detection portion 20, the abnormality detection portion 30, the arithmetic processing device 40, and the switching circuit 50 are mounted in the first mounting region MT1. The battery cells 10 in the battery cell group BL are connected as a power supply for the voltage detection portion 20, the abnormality detection portion 30, the arithmetic processing device 40, and the switching circuit 50 to the voltage detection portion 20, the abnormality detection portion 30, the arithmetic processing device 40, and the switching circuit 50.

A ground pattern GND1 is formed in the first mounting region MT1 except for the mounting regions for mounting the voltage detection portion 20, the abnormality detection portion 30, the arithmetic processing device 40 and the switching circuit 50, and formation regions where connection lines are formed. The ground pattern GND1 is connected to a base potential (ground potential) of the battery cells 10 in the battery cell group BL.

The communication driver 60 and the connectors CNa to CNc are mounted in the second mounting region MT2. A battery BAT that is not used as power for driving the electric vehicle is connected as a power supply for the communication driver 60 to the communication driver 60.

A ground pattern GND2 is formed in the second mounting region MT2 except for the mounting regions for mounting the communication driver 60 and connectors CNa-CNc, and formation regions where the connection lines are formed. The ground pattern GND2 is connected to a base potential (ground potential) of the battery BAT, which is not used as power for driving the electric vehicle.

As discussed above, the battery cells 10 in the battery cell group BL supplies electric power to the voltage detection portion 20, the abnormality detection portion 30, the arithmetic processing device 40, and the switching circuit 50. The battery BAT, which is not used as power for driving the electric vehicle, supplies electric power to the communication driver 60. Thus, the communication driver 60 can stably operate independent from the voltage detection portion 20, the abnormality detection portion 30, the arithmetic processing device 40, and the switching circuit 50.

The insulating element DIa straddles the insulating region INS. The insulating element DIa electrically insulates the arithmetic processing device 40 and the communication driver 60 from each other, and can transmit signals between the voltage detection portion 20 and the arithmetic processing device 40. The insulating element DIb straddles the insulating region INS. The insulating element DIb electrically insulates the switching circuit 50 and the connector CNb from each other, and can transmit signals between the switching circuit 50 and the connector CNb. Also, the insulating element DIb electrically insulates the communication circuit 38a of the abnormality detection portion 30 (see FIG. 4) and the connector CNc from each other, and can transmit signals between the communication circuit 38a of the abnormality detection portion 30 and the connector CNc. Also, the insulating element DIb electrically insulates the arithmetic processing device 40 and the connector CNc from each other, and can transmit signals between the arithmetic processing device 40 and the connector CNc. For example, digital isolators or photo couplers can be used as the insulating elements DIa and DIb. In this embodiment, digital isolators are used as the insulating elements DIa and the DIb.

The communication driver 60 and the connector CNa are connected to each other. Accordingly, the connector CNa can be provided with the values of the terminal voltages of the battery cells 10 and the temperatures in the battery module 100 that are provided from the arithmetic processing device 40. The bus BS shown in FIG. 1 is connected to the connector CNa.

The connector CNc of the N-th battery module 100 is connected to the battery ECU 510 through the signal line $P_0$. The connector CNb of the N-th battery module 100 is connected to the connector CNc of the (N−1)-th battery module 100 through the signal line $P_n$. The connector CNb of the (N−1)-th battery module 100 is connected to the connector CNc of the (N−2)-th battery module 100 through the signal line $P_{n-1}$. Similarly, the connector CNb of the 2nd battery module 100 is connected to the connector CNc of the 1st battery module 100 through the signal line $P_2$. The connector CNb of the 1st battery module 100 is connected to the battery ECU 510 through the signal line $P_1$.

(6) ID Assignment Mode

When receiving an ID assignment start signal for starting an ID assignment process from the battery ECU 510 through the bus BS, the arithmetic processing device 40 of the battery module 100 goes into the ID assignment mode. The operations of portions in each of the battery modules 100 in the ID assignment mode are now described.

In the ID assignment mode, the arithmetic processing device 40 stops the function of the abnormality detection portion 30. In this case, the status signal IC that is provided from the abnormality detection portion 30 is set "L" level. Correspondingly, the switching circuit 50 is brought into the status where the switching circuit can provide the ID assignment signal IS that is provided by the arithmetic processing device 40.

In the ID assignment mode, the ID assignment signal IS that is produced by the battery ECU 510 is provided to the arithmetic processing device 40 of the N-th battery module 100 through the signal line $P_0$, and the insulating element DIb of the N-th battery module 100.

The ID assignment signal IS that is issued by the arithmetic processing device 40 in the N-th battery module 100 is provided through the switching circuit 50, the insulating element DIb, the signal line $P_n$ and the insulating element DIb in the (N−1)-th battery module 100 to the arithmetic processing device 40 in the (N−1)-th battery module 100. The ID assignment signal IS that is issued by the arithmetic processing device 40 in the (N−1)-th battery module 100 is provided through the switching circuit 50, the insulating element DIb, the signal line $P_{n-1}$ and the insulating element DIb in the (N−2)-th battery module 100 to the arithmetic processing device 40 in the (N−2)-th battery module 100.

Similarly, the ID assignment signal IS that is issued by the arithmetic processing device 40 in the 2nd battery module 100 is provided through the switching circuit 50, the insulating element DIb, the signal line $P_2$ and the insulating element DIb in the 1st battery module 100 to the arithmetic processing device 40 in the 1st battery module 100. Note that the signal line $P_1$ is not used in the ID assignment mode.

If any ID is not assigned to the arithmetic processing device 40, the arithmetic processing device can only receive various signals, commands, and messages such as notification from the battery ECU 510 through the bus BS. After an ID is assigned to the arithmetic processing device 40, the arithmetic processing device can transmit and receive various signals, commands, and messages such as notification to and from the battery ECU 510 through the bus BS.

(7) ID Assignment Process

Figure 7:
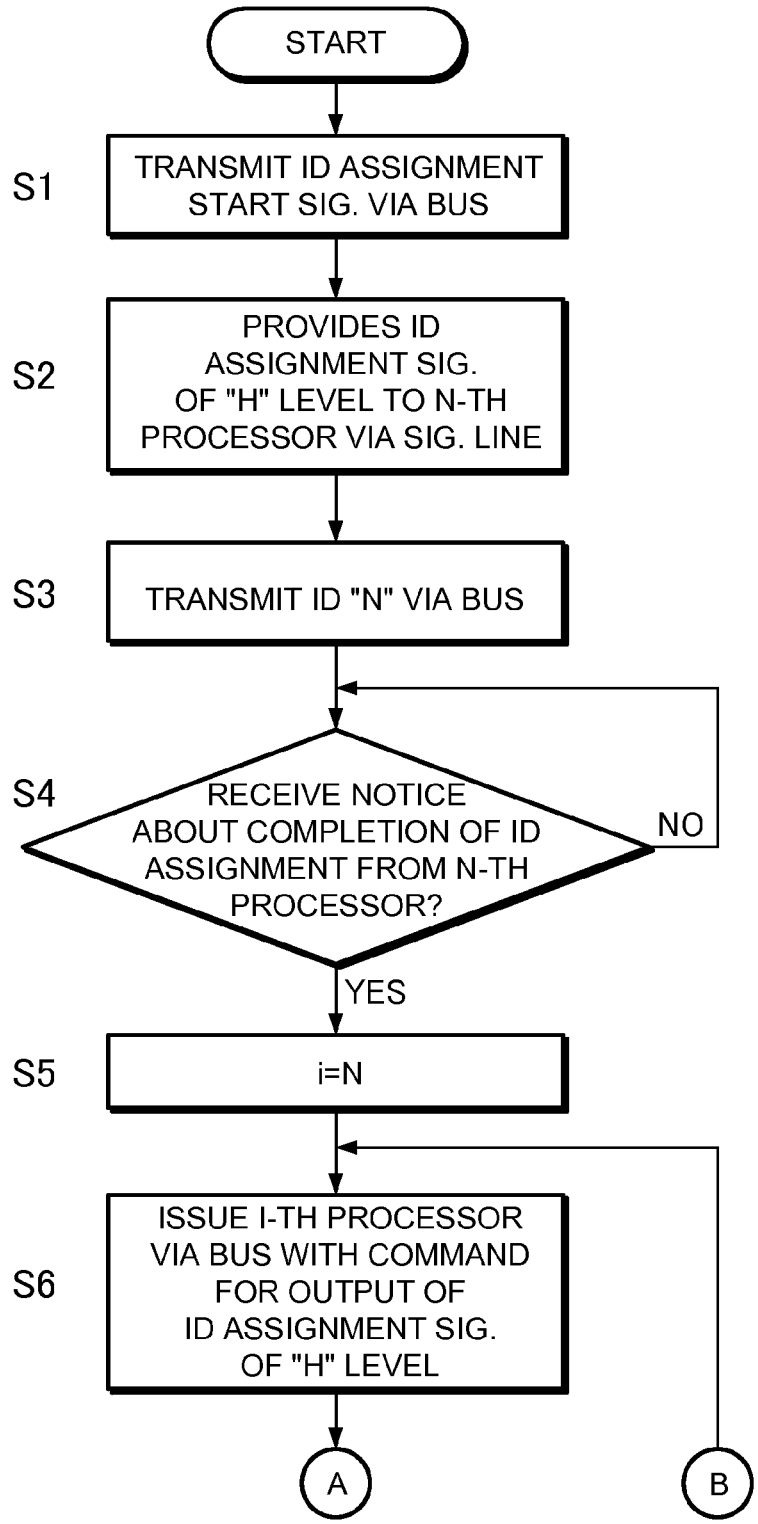
FIG. 7 is a flowchart showing an ID assignment process for assigning IDs to the arithmetic processing devices in the battery modules by using the battery ECU.
Figure 8:
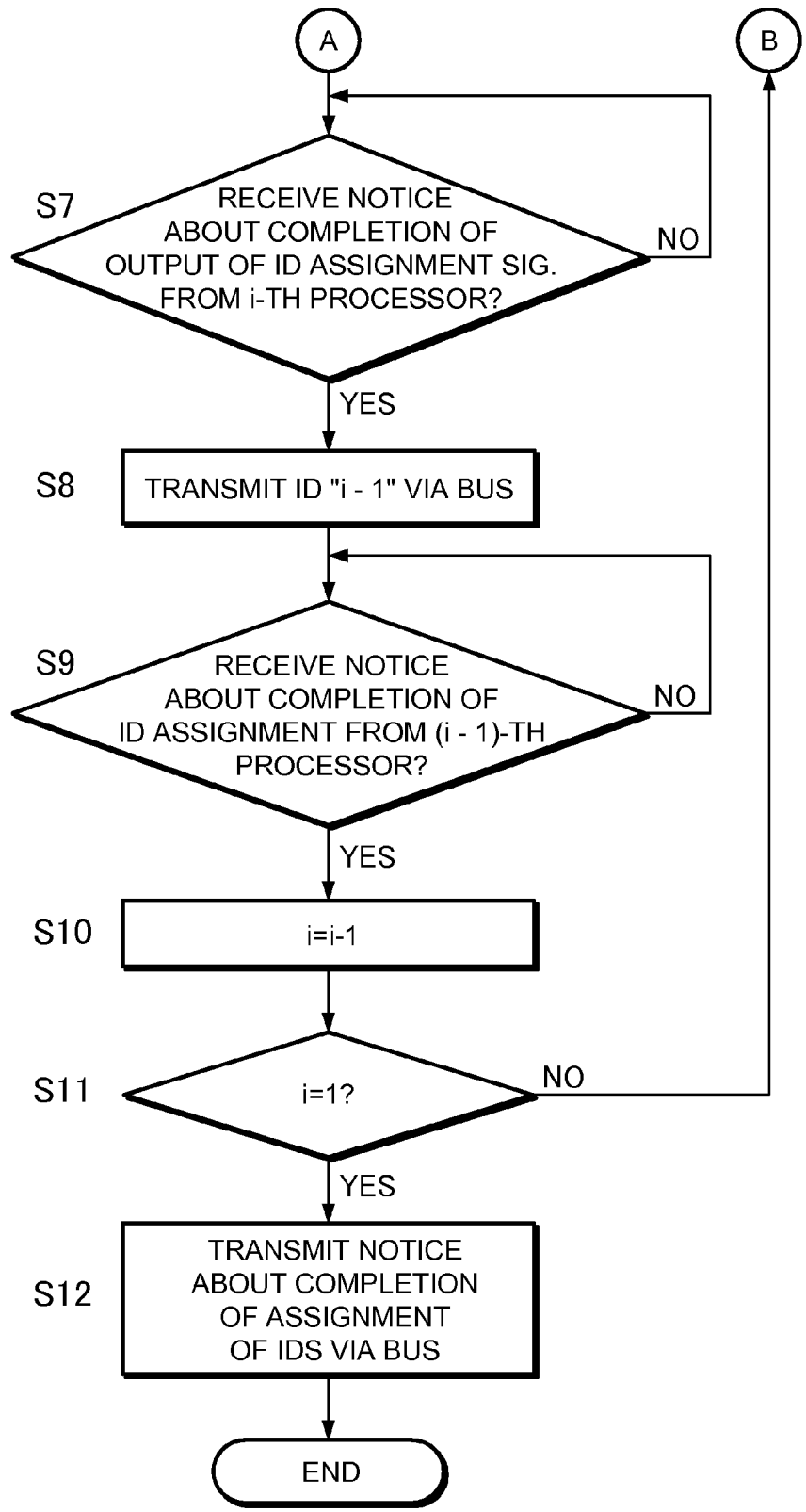
FIG. 8 is a flowchart showing an ID assignment process for assigning IDs to the arithmetic processing devices in the battery modules by using the battery ECU.

The ID assignment process for assigning IDs to the arithmetic processing devices 40 of the battery modules 100 by using the battery ECU 510 is now described. FIGS. 7 and 8 are flowcharts showing the ID assignment process for assigning IDs to the arithmetic processing devices 100 in the battery modules by using the battery ECU 510. Hereinafter, the arithmetic processing devices 40 in the 1st to N-th battery modules 100 are referred to as the 1st to N-th arithmetic processing devices 40.

First, the battery ECU 510 transmits the ID assignment start signal for starting the ID assignment process to the 1st to Nsth arithmetic processing devices 40 through the bus BS in the broadcasting manner (Step S1). Thus, all the arithmetic processing devices 40 go into the ID assignment mode from the normal mode. In this case, the arithmetic processing device 40 stops operation of the voltage detection portion 20 and the abnormality detection portion 30. Accordingly, the status signal IC that is provided from the abnormality detection portion 30 is set "L" level. As a result, the switching circuit 50 is brought into the status where the switching circuit can selectively provide the ID assignment signal IS that is provided by the arithmetic processing device 40.

Subsequently, the battery ECU 510 provides an N-th ID assignment signal IS of "H" level to the N-th arithmetic processing device 40 through the signal line $P_0$ (Step S2). Thus, the N-th arithmetic processing device 40 is requested for ID assignment. Subsequently, the battery ECU 510 transmits an ID "N" through the bus BS (Step S3). Thus, the N-th arithmetic processing device 40 receives the ID "N" through the bus BS.

The N-th arithmetic processing device 40 writes the received ID "N" into the RAM 42 (see FIG. 2). Thus, the ID "N" is assigned to the N-th arithmetic processing device 40. After that, the N-th arithmetic processing device 40 can transmit and receive messages to/from the battery ECU 510 through the bus BS. The N-th arithmetic processing device 40 transmits notification about completion of ID assignment to the battery ECU 510 through the bus BS.

The battery ECU 510 is in a standby status until receiving the notification about completion of ID assignment from the N-th arithmetic processing device 40 (Step S4). When receiving the notification about completion of ID assignment from the N-th arithmetic processing device 40, the battery ECU 510 assigns "N" to a variable i (natural number from 2 to N) (Step S5). After that, the battery ECU 510 issues the i-th arithmetic processing device 40 through the bus BS with a command for providing an (i−1)-th ID assignment signal IS of "H" level (Step S6).

When receiving the command for providing the (i−1)-th ID assignment signal IS of "H" level from the battery ECU 510 through the bus BS, the i-th arithmetic processing device 40 provides the (i−1)-th ID assignment signal IS of "H" level. After that, the i-th arithmetic processing device 40 transmits notification about completion of output of (i−1)-th ID assignment signal IS to the battery ECU 510 through the bus BS. The (i−1)-th ID assignment signal IS of "H" level that is provided by the i-th arithmetic processing device 40 is provided to the (i−1)-th arithmetic processing device 40 through the signal line. Thus, the (i−1)-th arithmetic processing device 40 is requested for ID assignment.

The battery ECU 510 is in a standby status until receiving the notification about completion of output of (i−1)-th ID assignment signal IS from the i-th arithmetic processing device 40 (Step S7). When receiving notification about completion of output of (i−1)-th ID assignment signal IS from the i-th arithmetic processing device 40, the battery ECU 510 transmits ID "i−1" through the bus BS (Step S8). Thus, the (i−1)-th arithmetic processing device 40 receives the ID "i−1" through the bus BS.

The (i−1)-th arithmetic processing device 40 writes the received ID "i−1" in the RAM 42 (see FIG. 2). Thus, the ID "i−1" is assigned to the (i−1)-th arithmetic processing device 40. After that, the (i−1)-th arithmetic processing device 40 can transmit and receive messages to/from the battery ECU 510 through the bus BS. The (i−1)-th arithmetic processing device 40 transmits notification about completion of ID assignment to the battery ECU 510 through the bus BS.

The battery ECU 510 is in a standby status until receiving the notification about completion of ID assignment from the (i−1)-th arithmetic processing device 40 (Step S9). When receiving the notification about completion of ID assignment from the (i−1)-th arithmetic processing device 40, the variable i is updated to "i−1" by the battery ECU 510 (Step S10). Subsequently, the battery ECU 510 determines whether the variable i is 1 (Step S11).

If the variable i is not 1, the procedure of the battery ECU 510 returns to Step S6. Steps S6 to S11 are repeated until the variable i becomes 1. Thus, the (N−1)-th to 1st arithmetic processing devices 40 writes the IDs "N−1" to "1", respectively, into the RAMs 42 (see FIG. 2). As a result, the IDs "N−1" to "1" are assigned to the (N−1)-th to 1st arithmetic processing devices 40, respectively.

If the variable i is 1, the battery ECU 510 transmits notification about completion of assignment of IDs to the 1st to N-th arithmetic processing devices 40 through the bus BS (Step S12). Thus, all the arithmetic processing devices 40 go into the normal mode from the ID assignment mode.

(8) Operation of Arithmetic Processing Device

Figure 9:
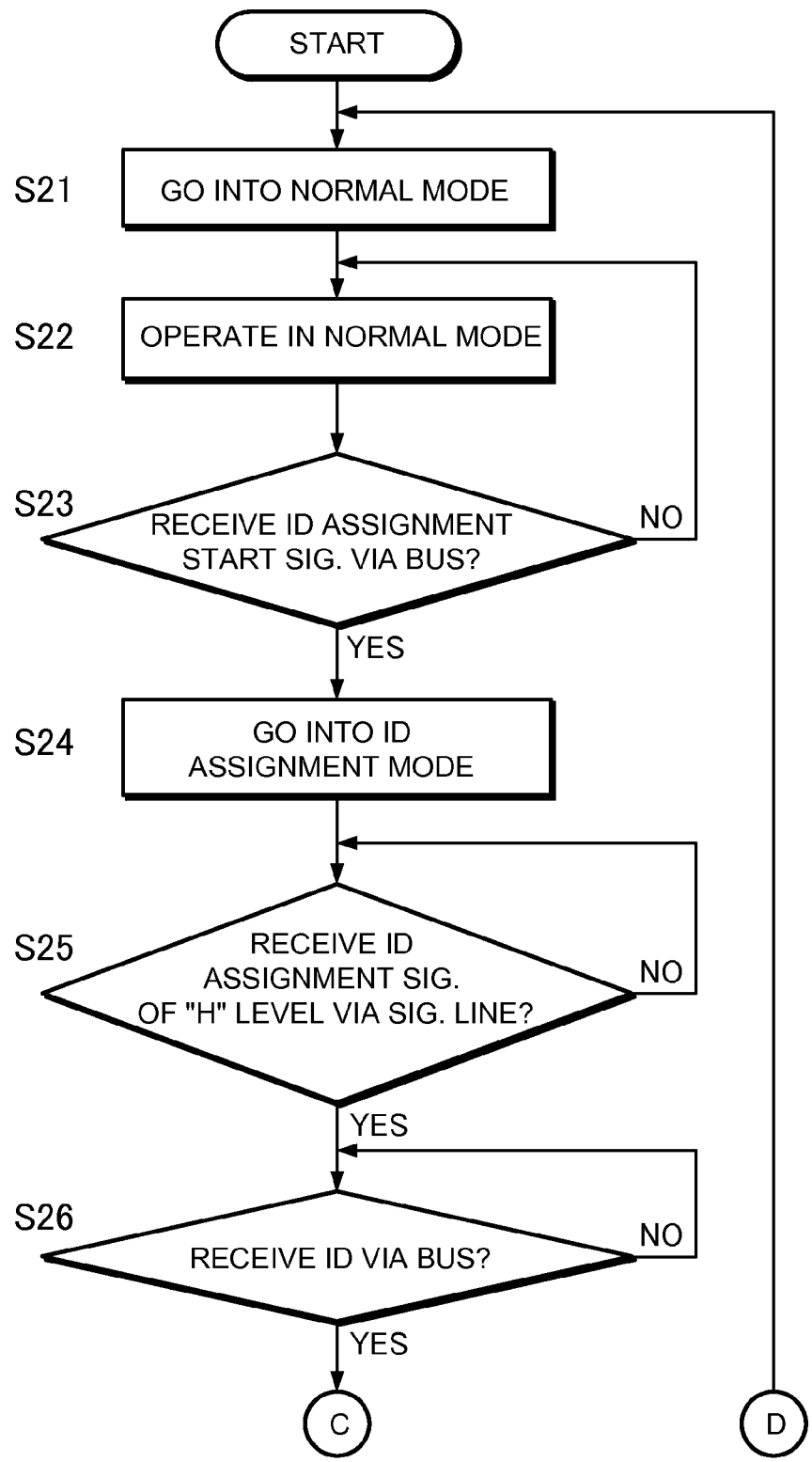
FIG. 9 is a flowchart showing operation of the arithmetic processing device in the ID assignment process.
Figure 10:
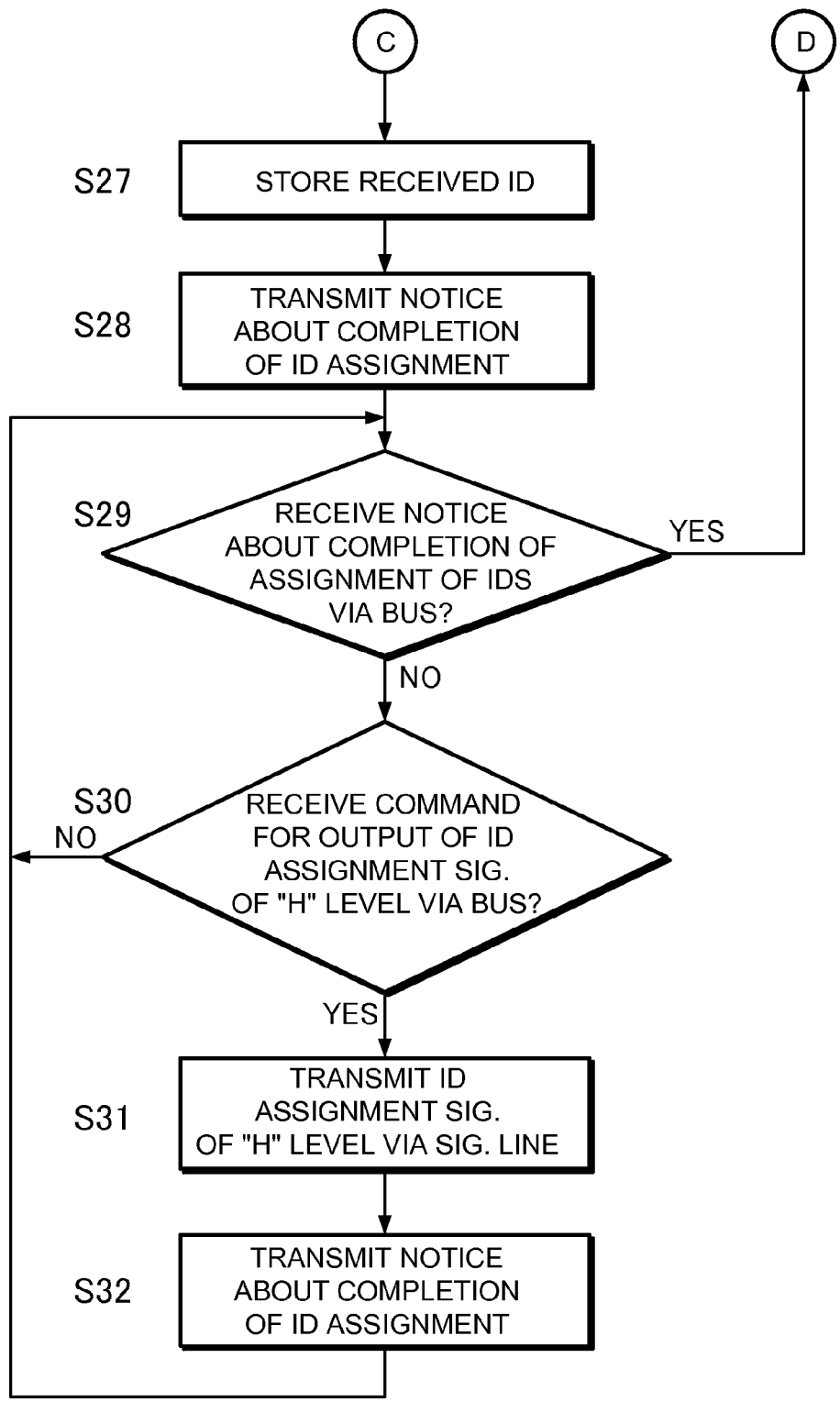
FIG. 10 is a flowchart showing operation of the arithmetic processing device in the ID assignment process.

The operation of the arithmetic processing device 40 in the ID assignment process of the battery ECU 510 is now described. FIGS. 9 and 10 are flowcharts showing operation of the arithmetic processing device 40 in the ID assignment process.

Here, the operation of the i-th arithmetic processing device (i is a natural number from 1 to N) 40 is described. The arithmetic processing device 40 goes into the normal mode on startup (Step S21), and operates in the normal mode (Step S22). Also, the arithmetic processing device 40 determines whether the ID assignment start signal is received from the battery ECU 510 through the bus BS (Step S23). If the ID assignment start signal is not received, the procedure of the arithmetic processing device 40 returns to Step S22, and the arithmetic processing device operates in the normal mode.

If the ID assignment start signal is received, the arithmetic processing device 40 goes into the ID assignment mode (Step S24). Subsequently, the arithmetic processing device 40 is in a standby status until receiving the i-th ID assignment signal IS of "H" level through the signal line (Step S25). If the i-th ID assignment signal IS of "H" level is received, the arithmetic processing device 40 is requested for ID assignment. In this case, the arithmetic processing device 40 is in a standby status until receiving an ID from the battery ECU 510 through the bus BS (Step S26).

When receiving the ID, the arithmetic processing device 40 writes the received ID into the RAM 42 (see FIG. 2) (Step S27). Thus, the ID is assigned to the arithmetic processing device 40. After that, the arithmetic processing device 40 can transmit and receive messages to/from the battery ECU 510 through the bus BS. In this case, the arithmetic processing device 40 transmits notification about completion of ID assignment to the battery ECU 510 through bus BS (Step S28).

Subsequently, the arithmetic processing device 40 determines whether the notification about completion of assignment of IDs is received from the battery ECU 510 through the bus BS (Step S29). If the notification about completion of assignment of IDs is not received, the arithmetic processing device 40 determines whether the command for providing the (i−1)-th ID assignment signal IS of "H" level is received from the battery ECU 510 through the bus BS (Step S30).

If the command for providing the (i−1)-th ID assignment signal IS of "H" level is not received, the procedure of the arithmetic processing device 40 returns to Step S29. If the command for providing the (i−1)-th ID assignment signal IS of "H" level is received, the arithmetic processing device 40 provides the (i−1)-th ID assignment signal IS of "H" level to the (i−1)-th arithmetic processing device 40 (Step S31). Subsequently, the arithmetic processing device 40 transmits notification about completion of output of the (i−1)-th ID assignment signal IS to the battery ECU 510 through bus BS (Step S32). After that, the procedure of the arithmetic processing device 40 returns to Step S29.

In Step S29, if the notification about completion of assignment of IDs is received, the arithmetic processing device 40 stores the ID that is written in the RAM 42 (see FIG. 2) in the nonvolatile memory 43 (see FIG. 2), and the procedure returns to Step S21. Thus, all the arithmetic processing devices 40 go into the normal mode from the ID assignment mode. After that, the arithmetic processing devices 40 operate in the normal mode by repeating Steps S22 and S23.

(9) Battery Module

Figure 11:
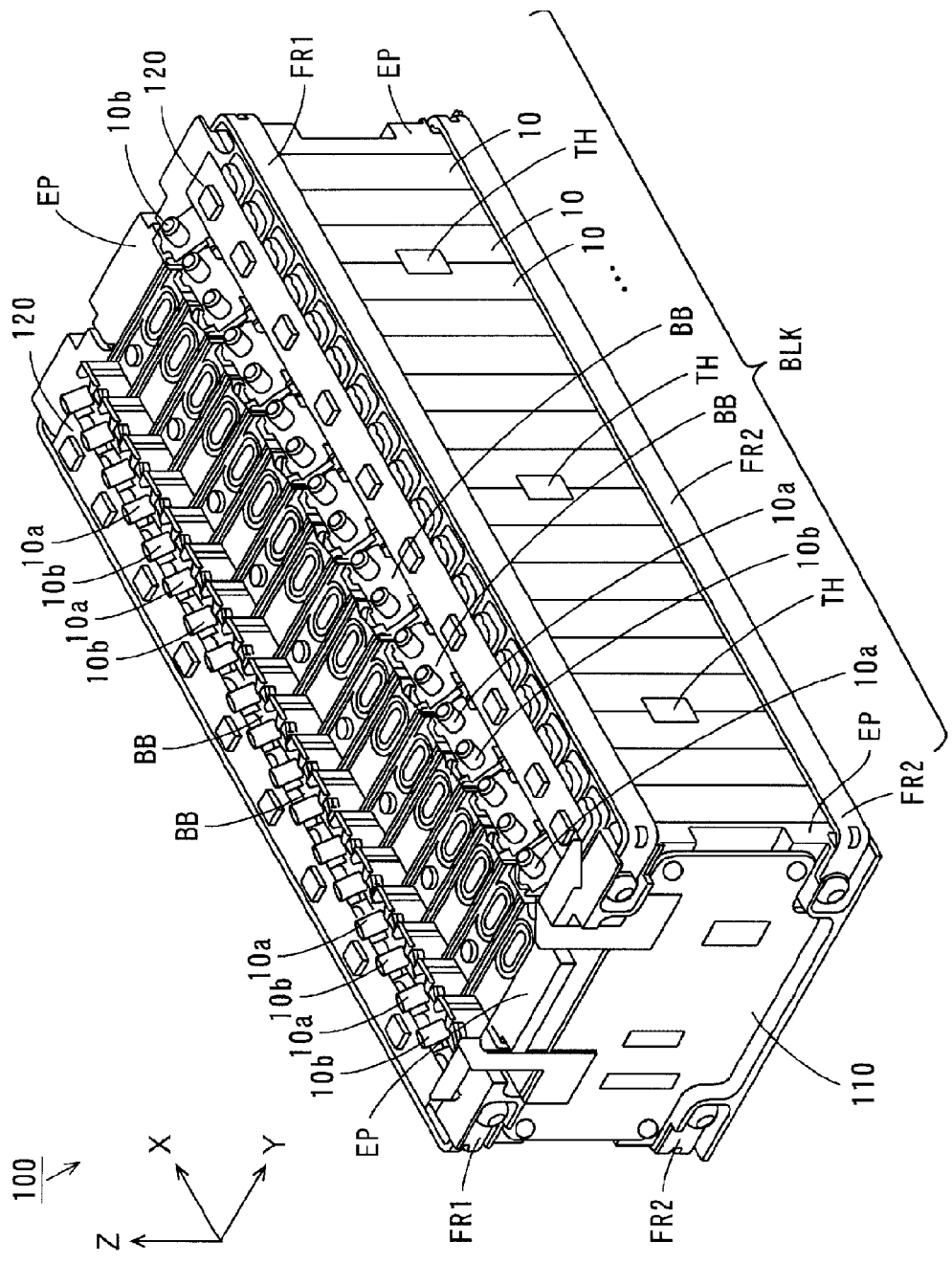
FIG. 11 is a perspective view showing an exemplary external appearance of the battery module.

The construction of the battery module 100 is now described. FIG. 11 is a perspective view showing an exemplary external appearance of the battery module 100. Here, three directions that intersect to each other at right angles are defined as X, Y and Z directions as shown by arrows of X, Y, and Z in FIG. 11. In this case, the X and Y directions extend in the horizontal plane, while the Z direction extends in the direction that intersects to the horizontal plane other at a right angle. In addition, the upward direction is indicated by the arrow Z.

As shown in FIG. 11, in the battery module 100, the battery cells 10, which include a low-profile, substantially rectangular parallelepiped shape, are arranged side by side in the X direction. A pair of end surface frames EP having a substantially plate shape are arranged in parallel to the Y-Z plane. A pair of upper end frames FR1 and a pair of lower end frames FR2 extend in the X direction. Each of the pair of end surface frames EP includes connection portions in the four corner parts to which the pair upper end frames FR1 and the pair lower end frames FR2 are connected. After the battery cells 10 are interposed between the pair of end surface frames EP, the pair of upper end frames FR1 are attached to the upper-side connection portions of the pair of end surface frames EP, while the pair of lower end frames FR2 are attached to the lower-side connection portions of the pair of end surface frames EP. Thus, the battery cells 10 are held as a unitary unit by the pair of end surface frames EP, and the pair of upper end frames FR1, and the pair of lower end frames FR2. A battery block BLK having a substantially rectangular parallelepiped shape is constructed of the battery cells 10, the pair of end surface frames EP, and the pair of upper end frames FR1, and the pair of lower end frames FR2. The battery block BLK includes the battery cell group BL shown in FIG. 1.

The printed circuit board 110 is attached to one of the end surface frames EP. The thermistors TH for detecting the temperatures of battery modules 100 are attached to a side surface of the battery block BLK.

In this embodiment, each of the battery cells 10 includes positive and negative terminals 10a and 10b, which are aligned to each other in the Y direction on the upper surface of the battery block BLK. In the battery module 100, the battery cells 10 are arranged with the battery cells adjacent to each other being flipped from side to side so that the positive and negative terminals 10a and 10b of the battery cells 10 adjacent to each other are flipped from side to side in the Y-directional relationship. In addition, the terminals 10a or 10b on one side of the battery cells 10 are aligned along one straight line in the X direction, while the terminals 10a or 10b on another side of the battery cells 10 are aligned along one straight line in the X direction.

According to this construction, in two battery cells 10 adjacent to each other, the positive terminal 10a of one of the two battery cells 10 is positioned in proximity to the negative terminal 10b of another of the two battery cells 10, while the negative terminal 10b of the one of the two battery cells 10 is positioned in proximity to the positive terminal 10a of the another of the two battery cells 10. In this arrangement, a bus bar BB, which is formed of copper, for example, is attached to the two terminals 10a and 10b that are positioned in proximity to each other. Thus, the battery cells 10 are connected in series to each other.

An elongated flexible printed circuit board (hereinafter, referred to as FPC board) 120 is arranged on one Y-directional side of each of the battery cells 10, and extends in the X direction. The FPC board as common board is connected to the bus bars BB. Another elongated FPC board 120 is arranged on another Y-directional side of each of the battery cells 10, and extends in the X direction. The FPC board as common board is connected to the bus bars BB.

The FPC boards 120 include a plurality of conductor wire lines W1 as discussed below with reference to FIG. 4 on an electrically insulating layer. The FPC boards are bendable or flexible. Polyimide is used as the material of the electrically insulating layer of the FPC board 120. Copper is used as the material of the conductor wire lines W1. The FPC board 120 is folded inward at a right angle along the upper end part of one of the end surface frames EP in the battery block BLK, and folded downward so that the FPC board is connected to the printed circuit board 110. According to this construction, the voltage detection portion 20 and the abnormality detection portion 30 shown in FIG. 1 are connected to the positive terminals 10a and 10b of the battery cells 10.

(10) Effects

In this battery system 500 as the communication system, the battery ECU 510 as the master device or control device is connected to the arithmetic processing devices 40 as the processing devices of the 1st to N-th battery modules 100 through the bus BS as communication line. The arithmetic processing devices 40 of the 1st to N-th battery modules 100 are the 1st to N-th arithmetic processing devices 40.

The battery ECU 510 provides the N-th arithmetic processing device 40 with the ID assignment signal IS that is the N-th assignment signal for a command for assigning an ID as identifier, and issues an ID of the N-th arithmetic processing device 40 through the bus BS. When receiving the N-th ID assignment signal IS, the N-th arithmetic processing device 40 stores the ID of the N-th arithmetic processing device 40, which is issued by the battery ECU 510. Thus, the ID of the N-th arithmetic processing device 40, which is issued by the battery ECU 510, is assigned to the N-th arithmetic processing device 40. After that, the battery ECU 510 can issue commands to the N-th arithmetic processing device 40 by using the ID, while the N-th arithmetic processing device 40 can receive the commands from the battery ECU 510 by using the ID.

The battery ECU 510 issues the i-th arithmetic processing device 40 (i is a natural number from N to 2) with a command for providing the (i−1)-th ID assignment signal IS to the (i−1)-th arithmetic processing device 40, and then issues an ID of the (i−1)-th arithmetic processing device 40 through the bus BS. Also, the i-th arithmetic processing device 40 provides the (i−1)-th arithmetic processing device with the (i−1)-th ID assignment signal IS in response to the command for providing the (i−1)-th ID assignment signal IS. When receiving the (i−1)-th ID assignment signal IS, the (i−1)-th arithmetic processing device 40 stores the ID of the (i−1)-th arithmetic processing device 40, which is issued by the battery ECU 510. Similar ID assignment is repeated from the N-th to 2nd arithmetic processing devices 40 in this order.

That is, the battery ECU 510 issues the N-th arithmetic processing device 40 with a command for providing the (N−1)-th ID assignment signal IS to the (N−1)-th arithmetic processing device 40, and then issues an ID of the (N−1)-th arithmetic processing device 40 through the bus BS. Also, the N-th arithmetic processing device 40 provides the (N−1)-th arithmetic processing device with the (N−1)-th ID assignment signal IS in response to the command for providing the (N−1)-th ID assignment signal IS. When receiving the (N−1)-th ID assignment signal IS, the (N−1)-th arithmetic processing device 40 stores the ID of the (N−1)-th arithmetic processing device 40, which is issued by the battery ECU 510.

Subsequently, the battery ECU 510 issues the (N−1)-th arithmetic processing device 40 with a command for providing the (N−2)-th ID assignment signal IS to the (N−2)-th arithmetic processing device 40, and then issues an ID of the (N−2)-th arithmetic processing device 40 through the bus BS. Also, the (N−1)-th arithmetic processing device 40 provides the (N−2)-th arithmetic processing device with the (N−2)-th ID assignment signal IS in response to the command for providing the (N−2)-th ID assignment signal IS. When receiving the (N−2)-th ID assignment signal IS, the (N−2)-th arithmetic processing device 40 stores the ID of the (N−2)-th arithmetic processing device 40, which is issued by the battery ECU 510.

Subsequently, the battery ECU 510 issues the (N−2)-th arithmetic processing device 40 with a command for providing the (N−3)-th ID assignment signal IS to the (N−3)-th arithmetic processing device 40, and then issues an ID of the (N−3)-th arithmetic processing device 40 through the bus BS. Also, the (N−2)-th arithmetic processing device 40 provides the (N−3)-th arithmetic processing device with the (N−3)-th ID assignment signal IS in response to the command for providing the (N−3)-th ID assignment signal IS. When receiving the (N−3)-th ID assignment signal IS, the (N−3)-th arithmetic processing device 40 stores the ID of the (N−3)-th arithmetic processing device 40, which is issued by the battery ECU 510.

Similar ID assignment is repeated so that the battery ECU 510 issues the 3rd arithmetic processing device 40 with a command for providing the 2nd ID assignment signal IS to the 2nd arithmetic processing device 40, and then issues an ID of the 2nd arithmetic processing device 40 through the bus BS. Also, the 3rd arithmetic processing device 40 provides the 2nd arithmetic processing device with the 2nd ID assignment signal IS in response to the command for providing the 2nd ID assignment signal IS. When receiving the 2nd ID assignment signal IS, the 2nd arithmetic processing device 40 stores the ID of the 2nd arithmetic processing device 40, which is issued by the battery ECU 510.

After that, the battery ECU 510 issues the 2nd arithmetic processing device 40 with a command for providing the 1st ID assignment signal IS to the 1st arithmetic processing device 40, and then issues an ID of the 1st arithmetic processing device 40 through the bus BS. Also, the 2nd arithmetic processing device 40 provides the 1st arithmetic processing device with the 1st ID assignment signal IS in response to the command for providing the 1st ID assignment signal IS.

Thus, the ID of the N-th to 2nd arithmetic processing devices 40, which are issued by the battery ECU 510, are assigned to the N-th to 2nd arithmetic processing devices 40, respectively. Finally, when receiving the 1st ID assignment signal IS, the 1st arithmetic processing device 40 stores the ID of the 1st arithmetic processing device 40, which is issued by the battery ECU 510. Thus, the ID of the 1st arithmetic processing device 40, which is issued by the battery ECU 510, is assigned to the 1st arithmetic processing device 40.

Thus, the N-th to 1st ID assignment signals IS are provided to the N-th to 1st arithmetic processing devices 40 one after another from the battery ECU 510 and the N-th to the 2nd arithmetic processing devices 40, and IDs of the N-th to 1st arithmetic processing devices 40 are issued by the battery ECU 510 through the bus BS. In this case, the battery ECU 510 can determine whether IDs are assigned to all the arithmetic processing devices 40. According to this construction, it is possible to ensure communication reliability between the battery ECU 510 and the arithmetic processing devices 40, and provide easy assignment of IDs to the arithmetic processing devices 40.

As a result, the arithmetic processing device 40 of each of the battery modules 100 can reliably transmit the detection results as the voltages of the battery cells 10 in the battery cell group BL, which are detected by the voltage detection portion 20, to the battery ECU 510.

In each of the battery modules 100, the terminal voltages of the battery cells 10 in the battery cell group BL are detected by the voltage detection portion 20. The arithmetic processing device 40 of each of the battery modules 100 can reliably transmit the values of terminal voltages of the battery cells 10 in the battery cell group BL, which are detected by the voltage detection portion 20, to the battery ECU 510.

In this embodiment, the battery ECU 510 is connected to the arithmetic processing devices 40 of the battery modules 100 by using CAN standard. In this case, the battery ECU 510 can be easily connected to the arithmetic processing devices 40 of the battery modules 100 in the broadcasting manner.

In addition, in this embodiment, each of the battery modules 100 includes the abnormality detection portion 30 as abnormality detection portion, and the switching circuit 50 as selection portion. The abnormality detection portion 30 detects charge/discharge abnormal conditions of the battery cell group BL, and issues the detection signal DB that indicates the abnormal conditions. The switching circuit 50 selectively provides one of the (i−1)-th ID assignment signal IS that is provided by the arithmetic processing device 40 and the detection signal DB that is provided by the abnormality detection portion 30. The battery ECU 510 is connected to the N-th arithmetic processing device 40 through the signal line $P_0$ as first signal line. The switching circuit 50 of the i-th battery module 100 is connected to the abnormality detection portion 30 and the arithmetic processing device 40 of the (i−1)-th battery module 100 through one of the signal lines $P_n$ to $P_2$ as second signal lines. The switching circuit 50 of the 1st battery module 100 is connected to the battery ECU 510 through the signal line $P_1$ as third signal line.

In the ID assignment mode, the battery ECU 510 provides the N-th ID assignment signal IS to the N-th arithmetic processing device 40 through the signal line $P_0$. The switching circuit 50 of the i-th battery module 100 provides the (i−1)-th ID assignment signal IS, which is provides from the i-th arithmetic processing device 40, to the (i−1)-th arithmetic processing device 40 through one of the signal lines $P_n$ to $P_2$.

In the normal mode, the switching circuit 50 of the i-th battery module 100 provides the (i−1)-th abnormality detection portion 30 through one of the signal lines $P_n$ to $P_2$ with the detection signal DB that is provided by the i-th abnormality detection portion 30, while the switching circuit 50 of the 1st battery module 100 provides the battery ECU 510 through the signal line $P_1$ with the detection signal DB that is provided by the 1st abnormality detection portion 30.

In this case, in the ID assignment mode, the battery ECU 510 provides the N-th ID assignment signal IS to the N-th arithmetic processing device 40 through the signal line $P_0$. The switching circuit 50 of the i-th battery module 100 provides the (i−1)-th ID assignment signal IS, which is provides from the i-th arithmetic processing device 40, to the (i−1)-th arithmetic processing device 40 through one of the signal lines $P_n$ to $P_2$.

In the normal mode, the switching circuit 50 of the i-th battery module 100 provides the (i−1)-th abnormality detection portion 30 through one of the signal lines $P_n$ to $P_2$ with the detection signal DB that is provided by the i-th abnormality detection portion 30. The switching circuit 50 of the 1st battery module 100 provides the battery ECU 510 through the signal line $P_1$ with the detection signal DB that is provided by the 1st abnormality detection portion 30.

As discussed above, the signal lines $P_n$ to $P_2$ for connection between the switching circuits 50 of the battery modules 100 are used both in the output of the (i−1)-th ID assignment signal IS in the ID assignment mode and the output of the detection signal DB in the normal mode. According to this construction, the battery system 500 can have the function of detecting charge/discharge abnormal conditions of the battery cell group BL without complicated structure and wiring of the battery system 500.

That is, the signal lines $P_n$ to $P_2$ for connection between the switching circuits 50 of the battery modules 100 are used both in the output of the ID assignment signals IS in the ID assignment mode and the output of the detection signals DB in the normal mode. According to this construction, it is possible to easily assign IDs to the arithmetic processing devices 40, and to detect abnormal terminal voltage conditions of the battery cell group BL without complicated structure and wiring of the battery system 500.

In addition, even if the voltage detection portion 20, the insulating element DIa or the communication driver 60 develops trouble, or if the bus BS develops trouble, it is possible to notify the battery ECU 510 through the switching circuits 50, the insulating elements DIb, and the signal line $P_n$ to $P_1$ about abnormal terminal voltage conditions of the battery cell group BL that is detected by the abnormality detection portion 30. Also, even if the abnormality detection portion 30 develops trouble, or if the signal line $P_n$ to $P_1$ develops trouble, it is possible to notify the battery ECU 510 through the arithmetic processing device 40, the insulating element DIa, the communication driver 60 and the bus BS about the values of the terminal voltages in the battery cell group BL that are detected by the voltage detection portion 20. Thus, it is possible to reliably notify the battery ECU 510 about abnormal terminal voltage conditions of the battery cell groups BL in the battery modules 100.

[2] Electric Vehicle (1) Construction and Operation

An electric vehicle is now described. The electric vehicle includes the battery system 500 according to the foregoing embodiment. Here, an electric car is described as an exemplary electric vehicle.

Figure 12:
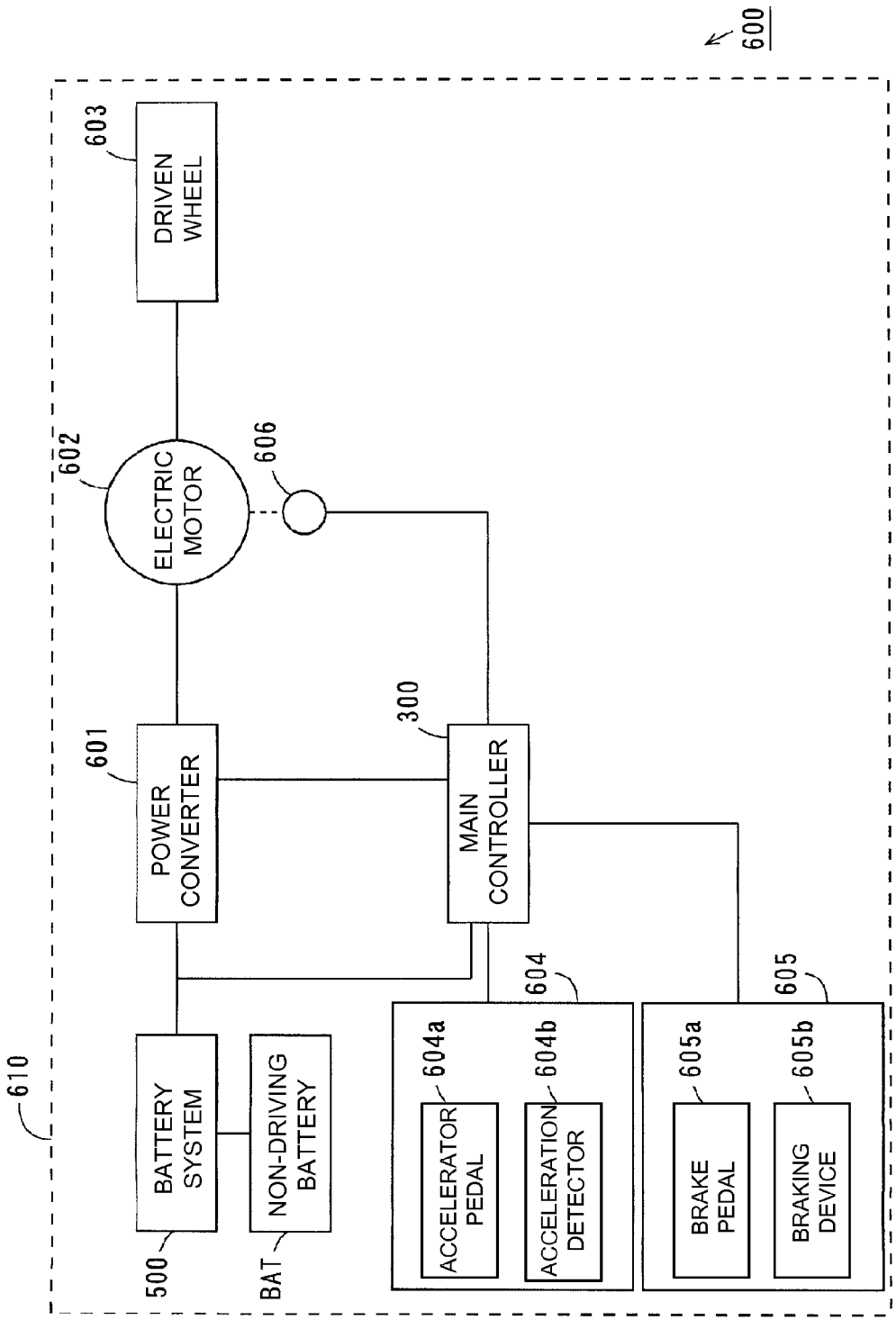
FIG. 12 is a block diagram showing the construction of an electric car that includes the battery system.

FIG. 12 is a block diagram showing the construction of an electric car that includes the battery system 500. As shown in FIG. 12, the electric car 600 includes a car body 610. The car body 610 includes the battery system 500 shown in FIG. 1, the battery BAT, which is not used as power for driving the electric vehicle, a power conversion portion 601, an electric motor 602, driven wheels 603, an accelerator pedal 604, a braking device 605, a rotational speed sensor 606, and the main control portion 300. In the case where the electric motor 602 is an alternating current (AC) electric motor, the power conversion portion 601 includes an inverter circuit. The battery system 500 includes the battery ECU 510 shown in FIG. 1.

The battery system 500 is connected to the electric motor 602 through the power conversion portion 601, and to the main control portion 300.

The charged amounts of the battery modules 100 (see FIG. 1) are provided to the main control portion 300 from the battery ECU 510 of the battery system 500. In addition, the accelerator device 604, the braking device 605, and the rotational speed sensor 606 are connected to the main control portion 300. The main control portion 300 includes a CPU and a memory, or a microcomputer, for example.

The accelerator device 604 includes an accelerator pedal 604a that is included in the electric car 600, and an acceleration detection portion 604b that detects an operated amount (depressed amount) of the accelerator pedal 604a. When the accelerator pedal 604a is operated by users, the acceleration detection portion 604b detects the operated amount of the accelerator pedal 604a relative to the reference where the accelerator pedal is not operated by users. The detected operated amount of the accelerator pedal 604a is provided to the main control portion 300.

The braking device 605 includes a brake pedal 605a that is included in the electric car 600, and a brake detection portion 605b that detects an operated amount (depressed amount) of the brake pedal 605a operated by users. When the brake pedal 605a is operated by users, the operated amount is detected by the brake detection portion 605b. The detected operated amount of the brake pedal 605a is provided to the main control portion 300. The rotational speed sensor 606 detects a rotational speed of the electric motor 602. The detected rotational speed is provided to the main control portion 300.

As discussed above, the main control portion 300 is provided with the charged amounts of the battery modules 100, the operated amount of the accelerator pedal 604a, the operated amount of the brake pedal 605a, and the rotational speed of the electric motor 602. The main control portion 300 controls charging and discharging operations of the battery modules 100, and power conversion of the power conversion portion 601 based on these types of information. For example, in driveaway or acceleration of the electric car 600 in accordance with the accelerator operation, the battery system 500 supplies the power conversion portion 601 with electric power of the battery module 100.

In addition, the main control portion 300 calculates a rotating force (command torque) to be transmitted to the driven wheels 603 in accordance with the provided operated amount of the accelerator pedal 604a, and provides the power conversion portion 601 with a control signal in accordance with the command torque.

When receiving the aforementioned control signal, the power conversion portion 601 converts the electric power supplied from the battery system 500 into electric power (driving electric power) required to drive the driven wheels 603. Thus, the driving electric power converted by the power conversion portion 601 is supplied to the electric motor 602, and a rotating force of the electric motor 602 is transmitted to the driven wheels 603 in accordance with the driving electric power.

On the other hand, in deceleration of the electric car 600 in accordance with the acceleration operation, the electric motor 602 serves as an electric generator. In this case, the power conversion portion 601 converts regenerative power that is produced by the electric motor 602 into electric power suitable for charging the battery cells 10, and provides the converted electric power to the battery cells 10. Thus, the battery cells 10 are charged.

(2) Effects

In the electric car 600 as electric vehicle, the electric motor 602 is energized by the electric power from the battery system 500 according to the foregoing embodiment. The driven wheels 603 are rotated by the rotating force of the electric motor 602 so that the electric car 600 runs.

Since the battery system 500 according to the foregoing embodiment is installed on the electric car 600, it is possible to ensure communication reliability between the battery ECU 510 and the arithmetic processing devices 40 of the battery modules 100, and provide easy assignment of IDs to the arithmetic processing devices 40. As a result, the arithmetic processing device 40 of each of the battery modules 100 can reliably transmit the detection results as the voltages of the battery cells 10 in the battery cell group BL, which are detected by the voltage detection portion 20, to the battery ECU 510.

The main control portion 300 may have the functions of the battery ECU 510. In this case, the main control portion 300 is connected to the communication drivers 60 (see FIG. 1) of the battery modules 100 included in the battery system 500 through the bus BS. In addition, the main control portion 300 is connected to the insulating element DIb (see FIG. 1) of the N-th battery module 100 included in the battery system 500 through the signal line $P_0$, and to the insulating element DIb (see FIG. 1) of the 1st battery module 100 included in the battery system 500 through the signal line $P_1$. Note that, in the case where the main control portion 300 has the functions of the battery ECU 510, it is not necessary for the battery system 500 to include the battery ECU 510.

(3) Other Mobile Units

Although it has been described that the battery system 500 shown in FIG. 1 is installed on the electric vehicle in the foregoing embodiment, the battery system 500 may be installed on other mobile units such as ship, aircraft, elevator, and walking robot.

For example, the ship, which includes the battery system 500, includes a hull, a screw, an acceleration input portion, and a deceleration input portion instead of the car body 610, the driven wheels 603, the accelerator device 604, and the braking device 605 shown in FIG. 12, respectively. Crews operate the acceleration input portion instead of the accelerator device 604 when accelerating the ship, and operate the deceleration input portion instead of the braking device 605 when decelerating the ship. In this case, the hull, the electric motor, and the screw correspond to a mobile body, a power source, and a driving portion, respectively. In this case, the electric motor is energized by electric power from the battery system 500, and converts the electric power into power for driving the ship so that the hull moves by rotating the screw by using the converted power.

Similarly, the aircraft, which includes the battery system 500, includes an airframe, a propeller, an acceleration input portion, and a deceleration input portion instead of the car body 610, the driven wheels 603, the accelerator device 604, and the braking device 605 shown in FIG. 12, respectively. In this case, the airframe, the electric motor, and the propeller correspond to a mobile body, a power source, and a driving portion, respectively. In this case, the electric motor is energized by electric power from the battery system 500, and converts the electric power into power for driving the aircraft so that the airframe moves by rotating the propeller by using the converted power.

For example, the elevator, which includes the battery system 500, includes an enclosed platform, an ascent/descent rope attached to the platform, an acceleration input portion, and a deceleration input portion instead of the car body 610, the driven wheels 603, the accelerator device 604, and the braking device 605 shown in FIG. 12, respectively. In this case, the platform, the electric motor, and the ascent/descent rope correspond to a mobile body, a power source, and a driving portion, respectively. In this case, the electric motor is energized by electric power from the battery system 500, and converts the electric power into power for driving the elevator so that the platform is moved by winding the ascent/descent rope by using the converted power.

For example, the walking robot, which includes the battery system 500, includes a body, legs, an acceleration input portion, and a deceleration input portion instead of the car body 610, the driven wheels 603, the accelerator device 604, and the braking device 605 shown in FIG. 12, respectively. In this case, the body, the electric motor, and the legs correspond to a mobile body, a power source, and a driving portion, respectively. In this case, the electric motor is energized by electric power from the battery system 500, and converts the electric power into power for driving the robot so that the body moves by moving the legs by using the converted power.

(4) Effects of Other Mobile Units

In the mobile unit that includes the battery system 500, the power source is energized by electric power from the battery system 500, and converts the electric power into power for driving the mobile unit so that the mobile body moves by using the power converted by the power source.

Since the battery system 500 according to the foregoing embodiment is installed on the mobile unit, it is possible to ensure communication reliability between the battery ECU 510 and the arithmetic processing devices 40, and provide easy assignment of IDs to the arithmetic processing devices 40. As a result, the arithmetic processing device 40 of each of the battery modules 100 can reliably transmit the detection results as the voltages of the battery cells 10 in the battery cell group BL, which are detected by the voltage detection portion 20, to the battery ECU 510.

[3] Power Supply Device (1) Construction and Operation

Figure 13:
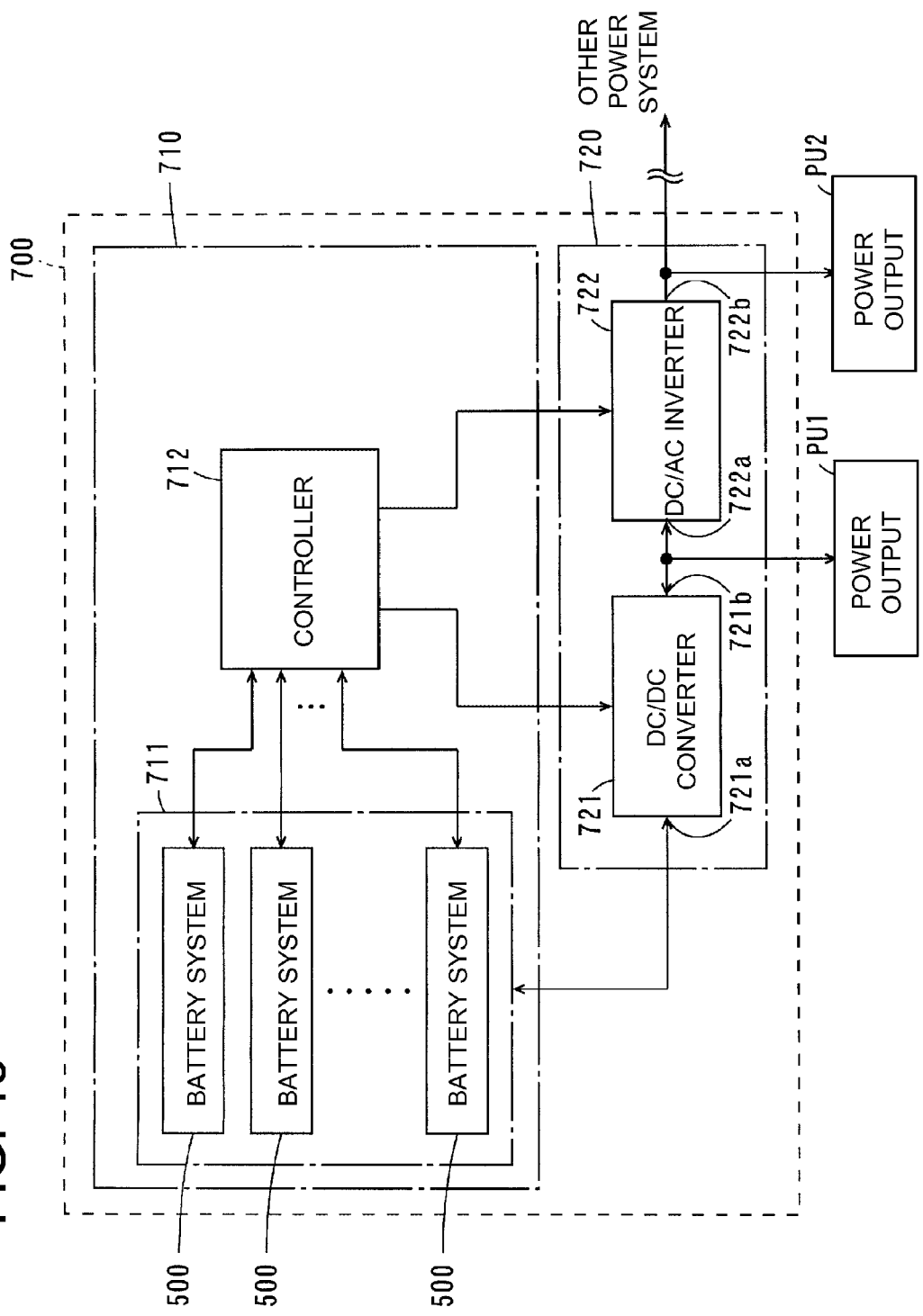
FIG. 13 is a block diagram showing the construction of a power supply device.

A power supply device is now described. FIG. 13 is a block diagram showing the construction of the power supply device. As shown in FIG. 13, the power supply device 700 includes an electric power storage device 710, and an electric power conversion device 720. The electric power storage device 710 includes a battery system group 711, and a controller 712. The battery system group 711 includes a plurality of battery systems 500. The plurality of battery systems 500 can be connected in parallel or in series to each other.

The controller 712 includes a CPU and a memory, or a microcomputer, for example. The controller 712 is connected to the battery ECUs 510 (see FIG. 1), which are included in the battery systems 500. The controller 712 controls the electric power conversion device 720 based on the charged amounts of the battery cells 10 that are provided from the ECUs 510. The controller 712 controls discharging or charging operation of the battery modules 100 in the battery systems 500 as discussed below.

The electric power conversion device 720 includes a DC/DC (direct current/direct current) converter 721, and a DC/AC (direct current/alternating current) inverter 722. The DC/DC converter 721 includes input/output terminals 721*a* and 721*b*. The DC/AC inverter 722 includes input/output terminals 722*a* and 722*b*. The input/output terminals 721*a* of the DC/DC converter 721 are connected to the battery system group 711 of the electric power storage device 710 through the HV connectors 530 (see FIG. 1) of the battery systems 500.

The input/output terminal 721*b* of the DC/DC converter 721 and the input/output terminal 722*a* of the DC/AC inverter 722 are connected to each other, and are connected to a power output portion PU1. The input/output terminal 722*b* of DC/AC inverter 722 is connected to a power output portion PU2, and to other electric power system.

The power output portions PU1 and PU2 include outlets. Various loads can be connected to the power output portions PU1 and PU2, for example. Other electric power system can include commercial power or a solar battery, for example. The power output portions PU1 and PU2, and other electric power system are examples of external device to which the power supply device is connected. In the case where a solar battery is used as electric power system, the solar battery is connected to the input/output terminal 721*b* of the DC/DC converter 721. Also, in the case where a solar energy power generation system including the solar battery is used as electric power system, an AC output portion of a power conditioner of the solar energy power generation system is connected to the input/output terminal 722*b* of the DC/AC inverter 722.

The controller 712 controls the DC/DC converter 721 and the DC/AC inverter 722 so that the battery system group 711 can be discharged and charged. When the battery system group 711 is discharged, the DC/DC converter 721 converts electric power that is provided from the battery system group 711 from DC (direct current) into DC (direct current), and the DC/AC inverter 722 additionally converts the converted electric power from DC (direct current) into AC (alternating current).

In the case where the power supply device 700 is used as DC power supply, electric power that is converted from DC into DC by the DC/DC converter 721 is provided to the power output portion PU1. In the case where the power supply device 700 is used as AC power supply, electric power that is converted from DC into AC by the DC/AC inverter 722 is provided to the power output portion PU2. Also, electric power that is converted into alternating current by the DC/AC inverter 722 can be supplied to other electric power system.

The controller 712 controls discharging operation of the battery modules 100 in the battery system group 711 as discussed below, for example. When the battery system group 711 is discharged, the controller 712 determines whether to stop discharging operation of the battery system group 711 or whether to restrict discharging current (or discharging electric power) based on the calculated charged amounts, and controls the electric power conversion device 720 based on the determination result. Specifically, if the charged amount of any of the battery cells 10 (see FIG. 1) included in the battery system group 711 becomes lower than a predetermined threshold, the controller 712 controls the DC/DC converter 721 and the DC/AC inverter 722 so that discharging operation of the battery system group 711 is stopped or discharging current (or discharging electric power) is restricted. According to this construction, it is possible to prevent that the battery cells 10 are overdischarged.

Discharging current (or discharging electric power) is restricted so that voltages in the battery system group 711 fall within a certain reference voltage range. The certain reference voltage range is specified by the controller 712 based on the charged amounts of the battery cells 10.

Also, when the battery system group 711 is charged, the DC/AC inverter 722 converts alternating current electric power that is provided from other electric power system from AC (alternating current) into DC (direct current), and the DC/DC converter 721 additionally converts the converted electric power from DC (direct current) into DC (direct current). When the electric power is supplied to the battery system group 711 through the DC/DC converter 721, the battery cells 10 (see FIG. 1) included in the battery system group 711 can be charged.

The controller 712 controls charging operation of the battery modules 100 in the battery system group 711 as discussed below, for example. When the battery system group 711 is charged, the controller 712 determines whether to stop charging operation of the battery system group 711 or whether to restrict charging current (or charging electric power) based on the calculated charged amounts, and controls the electric power conversion device 720 based on the determination result. Specifically, if the charged amount of any of the battery cells 10 (see FIG. 1) included in the battery system group 711 becomes higher than a predetermined threshold, the controller 712 controls the DC/DC converter 721 and the DC/AC inverter 722 so that charging operation of the battery system group 711 is stopped or charging current (or charging electric power) is restricted. According to this construction, it is possible to prevent that the battery cells 10 are overcharged.

Charging current (or charging electric power) is restricted so that voltages in the battery system group 711 fall within a certain reference voltage range. The certain reference voltage range is specified by the controller 712 based on the charged amounts of the battery cells 10.

The electric power conversion device 720 may only include one of the DC/DC converter 721 and the DC/AC inverter 722 as long as electric power can be supplied between the power supply device 700 and an external device. Also, the electric power conversion device 720 may be omitted as long as electric power can be supplied between the power supply device 700 and the external device.

(2) Effects

In this electric power storage device 710, the controller 712 as system control portion controls charging and discharging operation of the battery modules 100 of the battery systems 500 according to the foregoing embodiment. According to this construction, it is possible to prevent deterioration, overcharge, and overdischarge of the battery modules 100.

In addition, in this power supply device 700, the electric power conversion device 720 converts electric power between the battery system 500 and the external device. The electric power conversion device 720 is controlled by the controller 712 of the electric power storage device 710 so that charging and discharging operation of the battery modules 100 can be controlled. According to this construction, it is possible to prevent deterioration, overcharge, and overdischarge of the battery modules 100. That is, in the power supply device 700, the controller 712 controls electric power supply between the battery system group 711 and the external device. As a result, it is possible to prevent overcharge and overdischarge of the battery cells 10 included in the battery system group 711.

Since the power supply device 700 includes the battery system 500 according to the foregoing embodiment, it is possible to ensure communication reliability between the battery ECU 510 and the arithmetic processing devices 40 of the battery modules 100, and provide easy assignment of IDs to the arithmetic processing devices 40. As a result, the arithmetic processing device 40 of each of the battery modules 100 can reliably transmit the detection results as the voltages of the battery cells 10 in the battery cell group BL, which are detected by the voltage detection portion 20, to the battery ECU 510.

If detecting abnormal terminal voltage conditions of the battery cell groups BL, the controller 712 can control the electric power conversion device 720. For this reason, the contactor 520 shown in FIG. 1 can be omitted in each of the battery systems 500.

The controller 712 may have the functions of the battery ECU 510. In this case, the controller 712 is connected to the communication drivers 60 (see FIG. 1) of the battery modules 100 included in the battery system 500 through the bus BS. In addition, the controller 712 is connected to the insulating element DIb (see FIG. 1) of the N-th battery module 100 included in the battery system 500 through the signal line $P_0$, and to the insulating element DIb of the 1st battery module 100 included in the battery system 500 through the signal line $P_1$. Note that, in the case where the controller 712 has the functions of the battery ECU 510, it is not necessary for the battery system 500 to include the battery ECU 510.

[4] Other Embodiments (1) Although the battery module 100 includes a plurality of battery cells 10 in the foregoing embodiment, the present invention is not limited to this. The battery module 100 may consist of one battery cell 10.

(2) Although, as abnormal charge/discharge conditions of the corresponding battery cell group BL, the abnormality detection portion 30 detects abnormal terminal voltage conditions of the battery cells 10, the present invention is not limited to this. As abnormal charge/discharge conditions of the corresponding battery cell group BL, the abnormality detection portion 30 may detect abnormalities in electric current in the battery cell group BL, SOC (charged amount), overdischarge, overcharge, temperature of battery cell 10, and the like.

In the case where, as abnormal charge/discharge conditions of the corresponding battery cell group BL, the abnormality detection portion 30 detects abnormalities in electric current in the battery cell group BL, the battery module 100 includes a current detection portion that detects electric current flowing in the battery cell group BL.

(3) Although the battery ECU 510 provides the ID assignment signal IS to the N-th arithmetic processing device 40, and the i-th arithmetic processing device (i is a natural number from 2 to N) 40 provides the ID assignment signal IS to the (i−1)-th arithmetic processing device 40 in the foregoing embodiment, the present invention is not limited to this. The battery ECU 510 may provide the ID assignment signal IS to the 1st arithmetic processing device 40, and the j-th arithmetic processing device (j is a natural number from 1 to (N−1)) 40 may provide the ID assignment signal IS to the (j+1)-th arithmetic processing device 40.

(4) Although the battery ECU 510 is in a standby status until receiving the notification about completion of ID assignment from the N-th arithmetic processing device 40 as assignment of ID in Step S4 in the ID assignment (see FIG. 7), and the procedure goes to Step S5 after receiving notification about completion of ID assignment in the foregoing embodiment, the present invention is not limited to this. The battery ECU 510 may be in a standby status for a predetermined period as the process of Step S4 in the ID assignment. After the predetermined period elapse, the procedure may go to Step S5.

Also, although the battery ECU 510 is in a standby status until receiving the notification about completion of ID assignment from the (i−1)-th arithmetic processing device 40 as the process of Step S9 in the ID assignment (see FIG. 8), and the procedure goes to Step S10 after receiving notification about completion of ID assignment, the present invention is not limited to this. The battery ECU 510 may be in a standby status for a predetermined period as the process of Step S9. After the predetermined period elapse, the procedure may go to Step S10.

In this case, it is not necessary for the arithmetic processing device 40 to transmit notification about completion of ID assignment in Step S28 (see FIG. 10). For this reason, the procedure of the arithmetic processing device 40 can omit the process of Step S29.

(5) Although the battery ECU 510 is in a standby status until receiving the notification about completion of output of (i−1)-th ID assignment signal IS from the i-th arithmetic processing device 40 as the process of Step S7 in the ID assignment (see FIG. 8), and the procedure goes to Step S8 after receiving notification about completion of output of (i−1)-th ID assignment signal IS in the foregoing embodiment, the present invention is not limited to this. The battery ECU 510 may be in a standby status for a predetermined period as the process of Step S7. After the predetermined period elapse, the procedure may go to Step S8.

In this case, it is not necessary for the arithmetic processing device 40 to transmit notification about completion of output of ID assignment signal IS in Step S32 (see FIG. 10). For this reason, the procedure of the arithmetic processing device 40 can omit the process of Step S32.

(6) Although the battery ECU 510 communicates with the arithmetic processing devices 40 through the bus BS by using CAN standard in the foregoing embodiment, the present invention is not limited to this. For example, the battery ECU 510 may communicates with the arithmetic processing devices 40 through the signal lines $P_0$ and $P_n$ to $P_2$ by using PWM (Pulse Width Modulation), PCM (Pulse-Code Modulation), or other serial communication methods.

[5] Correspondence Between Elements in Claims and Components in Embodiments

Exemplary correspondence between elements in claims and components in embodiments is now described. However, the present invention is not limited to the following examples.

The battery ECU 510 is an example of master device or control device. The arithmetic processing device 40 is an example of slave device or processing device. The bus BS is an example of communication line. The ID assignment signal IS is an example of assignment signal. The battery system 500 is an example of communication system or battery system. The MPU 511 is an example of communication processing portion of the master device. The CPU 41 is an example of communication processing portion of the slave device. The RAM 42 is an example of memory portion. The battery module 100 is an example of battery module. The battery cell 10 is an example of battery cell. The battery cell group BL is an example of battery cell group. The voltage detection portion 20 is an example of voltage detection portion. The detection signal DB is an example of detection signal. The abnormality detection portion 30 is an example of abnormality detection portion. The switching circuit 50 is an example of selection portion. The signal line $P_0$ is an example of first signal line. The signal lines $P_n$ to $P_2$ are an example of second signal line. The signal line $P_1$ is an example of third signal line.

The electric motor 602 is an example of electric motor. The driven wheels 603 are an example of driven wheel. The electric car 600 is an example of electric vehicle. The car body 610, the hull of the ship, the airframe of the aircraft, the platform of the elevator, and the body of the walking robot are an example of mobile body. The electric motor 602, the driven wheels 603, the screw, the propeller, and the electric motor for winding the ascent/descent rope, and the legs of the walking robot are an example of power source. The electric car 600, the ship, the aircraft, the elevator, and the walking robot are an example of mobile unit. The controller 712 is an example of system control portion. The electric power storage device 710 is an example of electric power storage device. The power supply device 700 is an example of power supply device. The electric power conversion device 720 is an example of electric power conversion device.

Other various elements that have the construction or the function recited in claims can be used as elements in the claims.

The invention claimed is:

1. A battery system comprising:
   a control device; and
   1st to N-th battery modules,
   wherein each of the battery modules includes
      a battery cell group that includes one or a plurality of battery cells,
      a voltage detection portion that is arranged corresponding to the battery cell group, and detects voltages of the battery cells in the battery cell group,
      a processing device that transmits the detection result detected by the voltage detection portion to the control device,
      an abnormality detection portion that detects overcharge or overdischarge abnormal conditions of the battery cell group, and issue a detection signal indicating the abnormal conditions, and
      a selection portion that selectively provides one of an assignment signal, which is provided from the processing device, and the detection signal, which is issued by the abnormality detection portion,
   wherein the control device and each of the processing devices of the battery modules are connected to each other through a communication line,
   the processing devices of 1st to N-th battery modules is defined as 1st to N-th processing devices,
   the control device is connected to the N-th processing device through a first signal line,
   the selection portion of the i-th (i is a natural number from N to 2) battery module is connected to the abnormality detection portion and the processing device of the (i−1)-th battery module through a second signal line,
   the selection portion of the 1st battery module is connected to the control device through a third signal line,
   in an identifier assignment mode, the control device provides the N-th processing device with an N-th assignment signal as a command for storing an identifier through the first signal line, and then transmits an identifier of the N-th processing device through the communication line, wherein the control device provides with the i-th processing device a command for providing an (i−1)-th assignment signal to the (i−1)-th processing device, and then transmits an identifier of the (i−1)-th processing device through the communication line in order from the N-th to 2nd processing devices,
   when the i-th processing device receives the i-th assignment signal, the i-th processing device stores the identifier of the i-th processing device, which is transmitted by the control device, and provides the (i−1)-th processing device with the (i−1)-th assignment signal in response to the command for providing an (i−1)-th assignment signal, and the selection portion of the i-th battery module provides the (i−1)-th processing device with the (i−1)-th assignment signal, which is provided from the i-th processing device, through the the second signal line,
   when the 1st processing device receives the 1st assignment signal, the 1st processing device stores the identifier of the 1st processing device, which is transmitted by the control device, and
   in a normal mode, the selection portion of the i-th battery module provides the (i−1)-th abnormality detection portion with the detection signal, which is issued by the i-th abnormality detection portion, through the second signal line, and the selection portion of the 1st battery module provides the control device with the detection signal, which is issued by the 1st abnormality detection portion, through the third signal line.

2. The battery system according to claim 1, wherein the control device is connected to each of the processing devices of the battery modules by using CAN standard.

3. An electric vehicle comprising:
   the battery system according to claim 1;
   a driving electric motor that is energized by electric power of the battery system; and
   a driven wheel that is driven by rotation force of the electric motor.

4. A mobile unit comprising:
   the battery system according to claim 1;
   a mobile body; and
   a power source that converts electric power from the battery system into power for moving the mobile body.

5. An electric power storage device comprising:
   the battery system according to claim 1; and
   a system control portion that controls discharging and charging operations of the battery modules of the battery system.

6. A power supply device that is connected to an external device, the power supply device comprising:
   the electric power storage device according to claim 5; and an electric power conversion device that is controlled by the system control portion of the electric power storage device, and converts electric power between the battery system of the electric power storage device and the external device.

\* \* \* \* \*